United States Patent [19]
Young

[11] Patent Number: 5,499,191
[45] Date of Patent: Mar. 12, 1996

[54] MULTI-LEVEL LOGIC OPTIMIZATION IN PROGRAMMABLE LOGIC DEVICES

[75] Inventor: Stephen P. Young, Colorado Springs, Colo.

[73] Assignee: Minc Incorporated, Colorado Springs, Colo.

[21] Appl. No.: 898,955

[22] Filed: Jun. 15, 1992

[51] Int. Cl.$^6$ .................................................. G06F 17/50
[52] U.S. Cl. .......................................... 364/489; 364/488
[58] Field of Search ................................... 364/488, 489, 364/490, 491

[56] References Cited

PUBLICATIONS

Robert K. Brayton et al., "MIS: A Multiple–Level Logic Optimization System". IEEE 1987, pp. 1062–1081.
Giovanni De Micheli et al., "The Olumpus Synthesis System". IEEE, 1990, pp. 37–53.

Primary Examiner—Vincent N. Trans
Attorney, Agent, or Firm—Dorr, Carson, Sloan and Birney

[57] ABSTRACT

During compiling, a PLD circuit design system inserts nodes in the two level sum-of-product representation of the target circuit at function and procedure boundaries, the carries between bits of arithmetic operators, and the implicit nodes in complicated if statements. The nodes are collapsed providing that the number of unique symbols in the collapsed equations are $\leq$ than a first predetermined limit, the number of product terms are $\leq$ a second predetermined limit, and provided the collapsed equations meet constraints depending on whether or not there are inverters or XOR gates available, and whether or not the inverters and XOR gates are fusible. For all registers in the design, equations are generated to fit any possible flip-flop implementation of the register. Both the ON and OFF equations are generated and carried through the entire optimization process so that the DONT CARE information is retained and optimally used in the final equation reduction and device implementation.

54 Claims, 16 Drawing Sheets x.d=a*b*n
y.d=/a*m+b*/m+y*a
m=c*d*x+c*/d*/x+/c*/d*x+/c*d*/x
n=c*d x.d=a*b*c*d
y.d=/a*m+b*/m+y*a
m=c*d*x+c*/d*/x+/c*/d*x+/c*d*/x x.d=c*/a + c*/b + x*/a + x*/b + a*b*/c*/x x.d(~)=a*b*c* + a*b*x + /a*/c*/x + /b*/c*/x x.t = c*/a*/x + c*/b*/x + a*b*x + a*b*/c x.xorl=a*b
x.xorr=c+x

MULTI-LEVEL LOGIC OPTIMIZATION IN PROGRAMMABLE LOGIC DEVICES

BACKGROUND OF THE INVENTION

1. Field of the Invention

The invention in general relates to computer-assisted circuit design and more particularly to apparatus and methods for optimization of the design of programmable logic device circuits.

2. Statement of the Problem

Programmable logic devices (PLDs) are integrated circuit chips having a group of PLD inputs and a group of PLD outputs connected by a logic circuit that can be programmed by fusing various connecting wires. The logic circuit typically comprises an AND array, a set of OR gates, and a set of registers. The PLD inputs are applied to the AND array, the outputs of the AND array are input to the OR gates, the outputs of the OR gates are input to the registers, and the register outputs provide the PLD outputs. An enable driver may be interposed between each register output and the corresponding PLD output. Many state-of-the art PLDs also have XOR gates and inverters connected between the OR gates and the registers, and the XOR gates and inverters may or may not have a fusible bypass. Sometimes the inverter may be placed between the register and the PLD output. Generally the fusible inverter is implemented as an XOR gate with one input grounded and a fuse between the input and ground. Some or all of the registers may also have outputs that feed back into the logic array. Generally, such registers can be used as inputs, should the lines normally referred to as PLD inputs not be sufficient to implement the design. Generally, any conductor connecting any internal logic device to another is referred to as a node. A symbol identifies anything that inputs into the array, which includes the PLD inputs, any PLD output that can feed back into the array, and any internal node that feeds back into the array. The outputs together with any internal node that can feed back into the array are referred to as "resources".

Early PLDs were programmed simply by the programmer understanding the circuits and fusing appropriate wires in the AND array to cause the PLD to function as desired. However, as PLDs increased in number of inputs and outputs and the complexity of the circuits, it became difficult to program a PLD correctly without wasteful trial and error. Moreover, there are many ways to program a PLD to arrive at any particular function, and generally manual methods do not lead to the most efficient result. It is well-known, however, that logic devices and their interrelationships can be described in terms of Boolean algebra. In particular the logic in PLDs can be described in a sum-of-products representation. A sum-of-products representation consists of a logical OR of product terms. A product term is a logical AND of symbols or negated symbols. The operators OR, AND, and NEGATE are conventional Boolean operators represented as "+", "*", and "/" respectively Generally the inputs and outputs are represented as symbols, and in the discussion herein the inputs will be represented as letters at the beginning of the alphabet, such as a, b, and c, and the PLD outputs will be represented as letters at the ending of the alphabet, such as x, y, or z. For example x=a*b+c is a Boolean algebra sum-of-products equation stating that the logic value of the PLD output node x is equal to the Boolean sum of the product a,b and the product "c", where a, b, and, c represent the logic values of the input nodes. Each of the product terms (pterms), such as a*b and c in the above equation, represent a wire input into one of the OR gates. Thus, when it became difficult or impossible to program PLDs effectively by manual methods, design tools were introduced allowing designs to be described using high level language representations, that is representations that more closely resemble the way in which humans think, which representations were then manipulated to implement the logic in a PLD. Typical PLD design programs are Abel™ produced by Data I/O, Inc. and CUPL™ produced by Logical Devices, Inc.

Generally, the designer inputs the design parameters into the system either by means of a high level hardware description language (HDL) or by using draw tool software to input a schematic which is translated by software into a representation that can be read by the design software. Constraints on the equations are also input, by making declarations in high level languages, designating specific devices or values for nodes in schematics, and by selecting system parameters. A compiler then constructs Boolean equations representing the input design parameters and constraints, which equations are then reduced to a minimal representation via conventional algorithms, such as Espresso, a well-known reduction software package. The design program translates the resulting equations into data files that can be read by automatic PLD programming devices to fuse the appropriate wires in the PLDs to implement the design.

More recently, programs have been created which not only can design and implement the logic in a single PLD, but can also partition the equations to implement the logic in multiple PLDs. See for example U.S. patent application Ser. No. 07/782,288 on an invention of William O. McDermith et al. and the PLDesigner™ 2.1 software produced by Minc, Incorporated. The above systems also have the ability to consider user specified preferences, such as cost, speed, power consumed, and space occupied by a system to select the optimum implementation for the user's needs.

A disadvantage of the above-described PLD computer-assisted design tools are that they require the user to target particular designs. That is, their compilers all use predefined mappings from the constructs used to describe the logic to the implementation of the description in equations. This restricts the form of the equations to those included in the predefined mappings, and the designs to those corresponding to the restricted equations. In particular, the prior art PLD design tools require the user to declare a node in order to insert a node into the equations and require a user to avoid declaring a node to avoid having one implemented. This leaves the designer responsible for finding optimum solutions, and thus also restricts the range of the implementations. Thus there is a need for a PLD computer-assisted design system which permits the user to design at a higher level and permits more flexibility in implementing the final design. In particular there is a need for a PLD design tool that provides a compiler that can adjust the mappings on the fly to a more general set of equations.

In recent years complex software programs have been developed to optimize generalized logical structure. See for example, MIS: A Multiple-Level Logic Optimization System, by Robert K. Brayton, Richard Rudell, Alberto Sangiovanni-Vincentelli, and Albert R. Wang, *IEEE Transactions On Computer Aided Design*, Vol. CAD-6 No. 6, November 1987, pp. 1062–1082. Likewise, programs have been developed to optimize generalized logic circuits. See for example, The Olympus Synthesis System: by De Micheli, Ku, Mailhot, and Truong, *IEEE Design and Test of Computers*, October 1990, pp. 37–53. The above-referenced paper by Brayton et al. describes an optimization system in which the step of optimizing the Boolean equations comprises minimizing the area occupied by the logic equations, which, in terms of the electrical components, means that the electronic elements used are minimized. While this approach is efficient in terms of logic structure, it often does not result in the most effective use of PLDs. Minimizing the area of the equations can result in more equations, though each equation is short. Since, a PLD has a fixed number of resources and a fixed set of logic components, the optimal use of the logic according to the MIS paper may use up all the resources while leaving some of the logic components unused. This can result in an inefficient use of the PLDs because more PLDs than are necessary may be required to implement a design optimized in terms of total logic components. Thus there is a need for an optimization system that optimizes the use of PLDs in general, and in particular optimizes the number of resources used, within the constraints of the logic elements available.

In PLD logic circuits, as in all logic circuits, there are certain conditions in which particular nodes are designed to be in a logic 1 or ON state, other conditions in which the same nodes are designed to be in a logic 0 or OFF state, and other conditions in which the state of the same nodes is irrelevant, which conditions are called "DONT CARE" conditions. While the DONT CARE conditions are immaterial to the logic system operation, the DONT CARE information, that is the specifications of the various conditions for which the value of a symbol is irrelevant, is often useful in programming PLDs because a design that may not be implementable if a condition was specified as ON or OFF may be implementable if the condition is a "DONT CARE" condition, because the reduced equation may be smaller. Thus, prior art optimization systems, such as the system described in the Brayton et al. reference, provide for the specification of DONT CARE information by permitting the designer to declare certain conditions as DONT CARE conditions. Thus there is a need for an optimization system that preserves all DONT CARE information so that it can be taken advantage of during the hardware implementation.

As indicated above, many PLDs contain a set of registers. These registers may be implemented as either a D flip-flop, a JK flip-flop, an SR flip-flop, or a T flip-flop. Generally, a user may write the input equations in terms of one flip-flop, or the schematic is implemented in a specific flip-flop. This will tend to limit the device fitting process from the start, since the devices available to implement the described design depend on the flip-flop type used in the description. Thus an optimization system that is able to optimize for any flip-flop implementation would be highly desirable.

Prior art PLD tools may not be able to handle arithmetic operations for operands having more than a small number of bits. This is because the equations for such operations increase exponentially with the number of bits. By the time there are five or more bits, the equations may be so large that they no longer can be handled by the prior art systems, and even when they can be handled, the equations may be quite large, restricting the set of devices able to implement the design. Since operators having widths of eight bits and larger are becoming commonplace in digital circuitry, there is a need for a PLD design system that can handle arithmetic operands of arbitrary width.

3. Solution to the problem

The present invention solves the above problems by providing a computerized logic design system having an optimizer that minimizes the number of nodes used in the equations without exceeding the capabilities of the target devices. This means the number of resources used by the system is minimized.

The above minimization is performed with the constraint that the number of symbols in any given equation is less than or equal to a predetermined number set by the user. Since the symbols represent inputs, outputs that are used as inputs, and nodes that feed back into the array, and since the number of inputs is limited, this ensures that logic implementation will not exceed the resources available in the target hardware.

The above minimization is performed with the additional constraint that the number of product terms (pterms) in the sum of product equations is less than or equal to a predetermined number set by the user. Since the pterms represent the OR inputs, this ensures that sufficient OR inputs will be available to implement the design.

The optimizer according to the invention also utilizes user selectable parameters that take into account whether fusible inverters are present, whether the logic includes exclusive OR gates, and whether the target hardware has a fusible inverter to control the polarity of the exclusive OR. In each case the capabilities of the device is taken into account in the optimization of the equations, and all equations are retained that enhance the selections available.

The minimization of the nodes is accomplished by tentatively collapsing nodes into the other equations, checking to see if any of the other equations expand beyond the limits discussed above, and then collapsing only if the collapsed equations would be acceptable in terms of the above criteria.

In order to increase the flexibility of choosing which nodes to collapse, prior to node collapsing, nodes are introduced at the carry-bits of arithmetic and relational operators, at function and procedure boundaries, and at the condition equation of complex IF statements. This introduction of nodes, allows the optimizer according to the invention to handle operators of arbitrary bit widths. It also results in a more generalized group of starting equations and more flexibility in creating nodes, optimization, and implementing the logic system.

The computerized logic design system according to the invention also provides a compiler that for each of each of the Boolean equations in the representation, writes both the ON version of the equation and the OFF version of the equation. The optimization process is performed separately for both equations, thus both equations are retained throughout the optimization process. Since the DONT CARE information consists of every condition not included in either the ON equation or the OFF equation, all DONT CARE information is retained throughout the optimization process.

The optimizer according to the invention also synthesizes all register implementations, utilizing all the possible flip-flop types. The synthesis is performed by translating each equation that feeds a flip-flop into the corresponding equations for an identical circuit having all the other varieties of flip-flops substituted for the specified flip-flop. For example, if equations are described feeding the J and K inputs of a JK flip-flop, the equations are translated into equations that feed the D input of a D flip-flop, the S and R inputs of an SR flip-flop, and the T input of a T flip-flop. Equation reduction is performed on each of these representations so that each representation is minimal. The automatic partitioning system as described in the McDermith et al. application referenced above can then implement the associated symbol in devices with any flip-flop type.

The register synthesis is performed by mapping each equation for a flip-flop that is not a D flip-flop into the equation for a D flip-flop and then from the D flip-flop to every other type of flip-flop. This process optimizes the two equations for the JK flip-flop, and the two equations for the SR flip flop, since it incorporates the interactions of the equations into the optimization system.

SUMMARY OF THE INVENTION

The invention provides a system for designing logic circuits to be implemented in one or more programmable logic devices, the system comprising: a data storage device, the data storage device having stored therein information representing details of a plurality of programmable logic devices, each of the devices having a limited number of resources and a limited number of logic components per resource; data input means for inputting information related to a logic circuit into the data storage device; and computer means for designing one or more logic circuits for implementation in the programmable logic devices, the computer means comprising resource minimizing means for minimizing the number of the resources without exceeding the limited number of logic components per resource. Preferably, the logic components comprise at least one OR gate having a predetermined number of inputs, and the minimization means comprises means for minimizing the number of resources without exceeding the number of the logic inputs. Preferably, the logic components further comprise a fusible inverter, and the minimization means comprises means for taking into account the presence of the fusible inverter to minimize the resources. Preferably, the logic components further comprise an XOR gate, and the minimization means comprises means for taking into account the presence of the XOR gate to minimize the resources. Preferably, the logic components further comprise a fusible XOR gate, and the minimization means comprises means for taking into account the presence of the fusible XOR gate to minimize the resources. Preferably, the programmable logic devices have one or more registers, the input information includes register information, and wherein the computer means comprises register synthesis means for generating a logic circuit design for every type of register available when the input information specifies a register in the logic circuit, and logic circuit design selection means for permitting the selection of the optimum one of the generated circuits designs. Preferably, the system further includes final reducing means for reducing the logic in the logic circuit after the circuit has been designed, and the input information includes DONT CARE information, and the computer means comprises DONT CARE information retaining means for retaining all of the DONT CARE information until the final reducing means reduces the logic circuit.

In another aspect, the invention provides a computerized electronic design system comprising: a data storage device, the data storage device having stored therein details of a plurality of programmable electronic devices, each of the devices having one or more registers; data input means for inputting data related to a logic circuit into the data storage device; and computer means for designing one or more logic circuits for implementation in one or more of the programmable electronic devices, the computer means comprising: register synthesis means for generating a logic circuit design for every type of register available when the input data specifies a register in the logic circuit; and logic circuit design selection means for selecting one of the generated circuit designs. Preferably, the computer means further comprises partitioning means for partitioning the logic circuit into a plurality of PLDs, the partitioning means choosing between the generated circuit designs to perform the partitioning. Preferably, the register synthesis means comprises means for generating a first logic circuit design utilizing a D flip-flop, a second logic circuit utilizing a JK flip-flop, a third logic circuit design utilizing an SR flip-flop, and a fourth logic circuit design utilizing a T flip-flop when the input data specifies any flip-flop from the group comprising a D flip-flop, a JK flip-flop, an SR flip-flop, and a T flip-flop.

In a further aspect, the invention provides a computerized electronic design system comprising: a data storage device, the data storage device having stored therein details of a plurality of programmable electronic devices; data input means for inputting data related to a logic circuit into the data storage device, the data including DONT CARE information; and computer means for designing one or more representations of logic circuits for implementation in one or more of the programmable electronic devices, the computer means comprising: final reducing means for reducing the circuit representations after they have been designed; DONT CARE information retaining means for retaining all of the DONT CARE information until the final reducing means reduces the one or more circuit representations; and implementing means for selecting one or more of the circuit representations and implementing it into a programmable electronic device. Preferably, the logic circuit includes a circuit output and the DONT CARE information retaining means comprises means for generating a first circuit representation related to the ON state of the output and for generating a second circuit representation related to the OFF state of the output, and the DONT CARE information is whatever state or states are not included in the first and second representations. Preferably, the DONT CARE information retaining means comprises means for preserving the ON and OFF state information until the final reduction process.

In still another aspect, the invention provides a computerized design system for designing a logic circuit to be implemented in one or more programmable logic devices, the system comprising: a data storage device; data input means for inputting data to be used in the design of the logic circuit into the data storage device, the data including a maximum symbols parameter; compiler means communicating with the data storage device for generating one or more equations representative of the logic circuit, the equations including one or more nodal equations representing nodes of the logic circuit in terms of symbols representing one or more logic elements from the group comprising: inputs to the logic circuit, outputs to the logic circuit, and nodes of the logic circuit; node minimizing means for minimizing the number of the nodal equations without causing the number of unique symbols in any one of the equations to exceed the maximum signals parameter; and implementing means for translating the equations into one or more implementations of the logic circuit in the one or more programmable logic devices. Preferably, the equations are sum-of-products equations, and the parameters include a maximum product terms parameter, and the node minimizing means further comprises means for minimizing the number of the nodal equations without causing the number of product terms in any of the equations to exceed the maximum product terms parameter. Preferably, the minimizing means comprises collapsing means for tentatively collapsing a selected node into the other equations, checking to see if any of the other equations expand beyond the maximum symbols and maximum pterm limits, and then collapsing the selected node only if the none of the collapsed equations exceed the limits. Preferably, the equations are sum-of-products equations and include an exclusive-OR of two sum-of-products equations, the compiler means comprises means for generating both the ON representation and the OFF representation for each of the equations, the input data further includes a maximum product terms parameter, a polarity control parameter, an XOR polarity control parameter, and a maximum XOR product terms parameter, and the node minimizing means comprises collapsing means for collapsing a selected node into the other equations if: the polarity control parameter is true and either the number of ON product terms or the number of OFF product terms is less than or equal to the maximum product terms parameter; or the polarity control is false and both the number of ON product terms and the number of OFF product terms are less than or equal to the maximum product terms parameter; or both the number of XOR LEFT ON product terms and the number of XOR LEFT OFF product terms is equal to 1 and the XOR polarity control parameter is true and either the number of XOR RIGHT ON product terms or the number of XOR RIGHT OFF product terms is less than or equal to the maximum XOR product terms parameter; or either the number of XOR LEFT ON product terms or the number of XOR LEFT OFF product terms is equal to 1 and the XOR polarity control parameter is false and both the number of XOR RIGHT ON product terms and the number of XOR RIGHT OFF product terms are less than or equal to the maximum XOR product terms parameter; or both the number of XOR RIGHT ON product terms and the number of XOR RIGHT OFF product terms are equal to 1 and either the number of XOR LEFT ON product terms or the number of XOR LEFT OFF product terms is less than or equal to the maximum XOR product terms parameter; or either the number of XOR RIGHT ON product terms or the number of XOR RIGHT OFF product terms is equal to 1 and the XOR polarity control parameter is true and either the number of XOR LEFT ON product terms or the number of XOR LEFT OFF product terms is less than or equal to the maximum XOR product terms parameter; or either the number of XOR RIGHT ON product terms or the number of XOR RIGHT OFF product terms is equal to 1 and the XOR polarity control parameter is false and both the number of XOR LEFT ON product terms and the number of XOR LEFT OFF product terms are less than or equal to the maximum XOR product terms parameter. Preferably, the compiler further comprises node insertion means for inserting nodes into the equations. Preferably, the node insertion means comprises means for inserting nodes at the carry-bits of arithmetic and relational operators, at function and procedure boundaries, and to break up complex constructs.

The invention also provides a method of designing a logic circuit to be implemented in one or more programmable logic devices, the method comprising the steps of: inputting data to be used in the design of the logic circuit into a data storage device, the data including a maximum symbols parameter; compiling one or more equations representative of the logic circuit, the equations including one or more nodal equations representing nodes of the logic circuit in terms of symbols representing one or more logic elements from the group comprising: inputs to the logic circuit, outputs to the logic circuit, and nodes of the logic circuit; minimizing the number of the nodal equations without causing the number of unique symbols in any one of the equations to exceed the maximum signals parameter; and translating the equations into one or more implementations of the logic circuit in the one or more programmable logic devices.

In a another aspect the invention provides a method of designing a logic circuit to be implemented in a programmable logic device having a limited logic capability, the method comprising: inputting data to be used in the design of the logic circuit into a data storage device; generating one or more equations representative of the logic circuit, the equations including one or more nodal equations representative of nodes of the logic circuit; minimizing the number of the nodal equations without exceeding the logic capabilities of the programmable logic device; and translating the equations into one or more implementations of the logic circuit in the programmable logic device. Preferably, the step of compiling further comprises inserting nodes into the equations at the carry-bits of arithmetic and relational operators, at function and procedure boundaries, and to break up complex constructs.

In still another aspect the invention provides a method of computerized electronic design comprising the steps of: providing a data storage device having stored therein details of a plurality of programmable electronic devices; inputting data related to a logic circuit into the data storage device, the data including DONT CARE information; designing one or more representations of logic circuits for implementation in one or more of the programmable electronic devices on a computer while retaining all of the DONT CARE information; using the DONT CARE information while reducing the circuit representations; and selecting one or more of the circuit representations and implementing it into a programmable electronic device.

In another aspect the invention also provides a method of computerized electronic logic circuit design comprising the steps of: providing a data storage device have details of a plurality of programmable electronic devices stored therein, each of the devices having one or more registers; inputting data related to a logic circuit into the data storage device, the data including register information; designing on a computer one or more logic circuits for implementation in one or more of the programmable electronic devices; generating a logic circuit design for every type of register available when the input data specifies a register in the logic circuit; and selecting and implementing of one of the generated circuit designs.

The invention not only provides a PLD optimizer system that optimizes the number of resources used within the limits provided by the logic available, but it also permits a wider selectivity among PLD devices and parameters than prior art optimizers. Numerous other objects and advantages of the invention will become apparent from the following description when read in conjunction with the accompanying drawings.

DESCRIPTION OF THE PREFERRED EMBODIMENT

1. Overview

Figure 1:
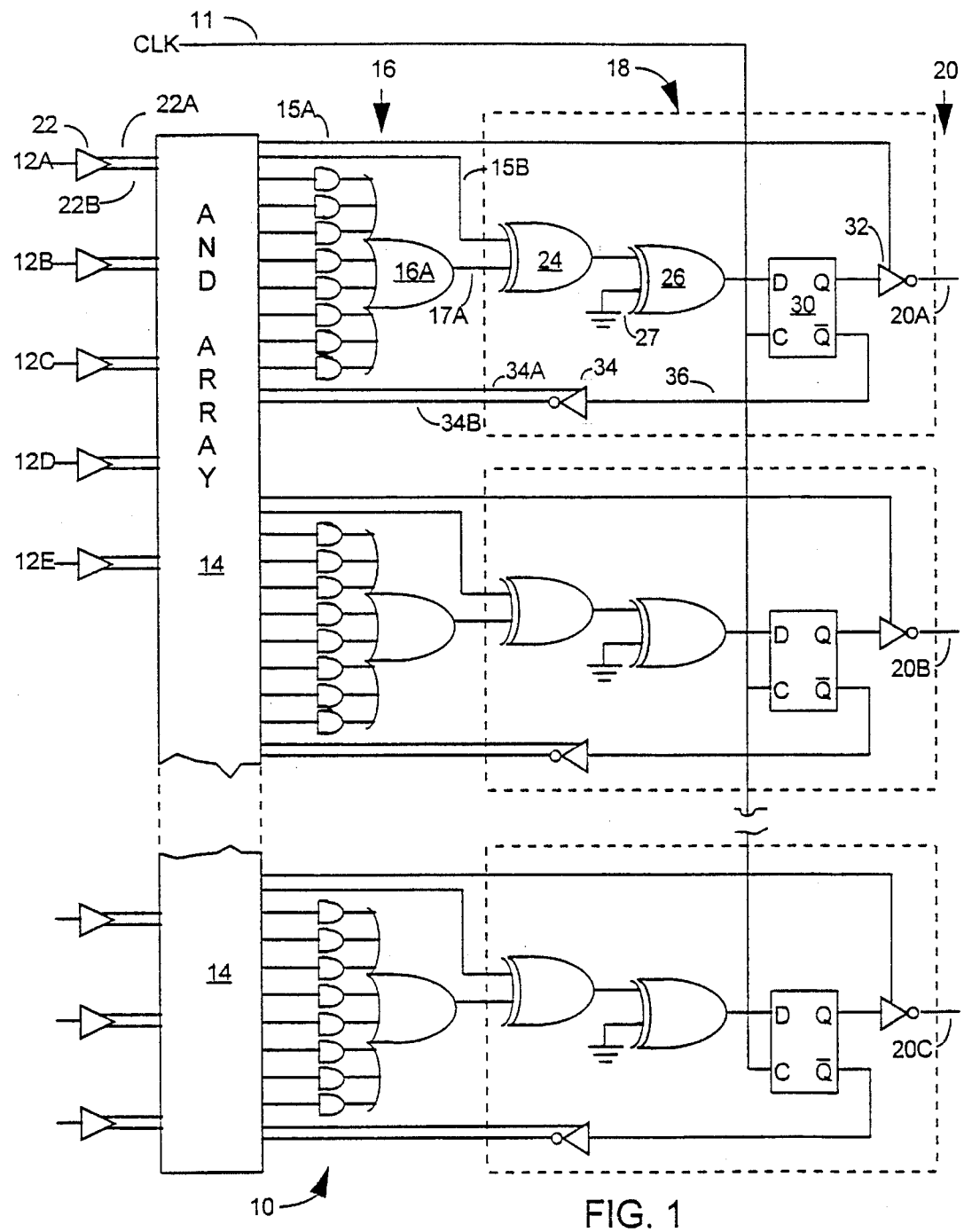
FIG. 1 is a generalized circuit diagram of a programmable logic device.

FIG. 1 shows a generalized circuit diagram of a programmable logic device 10, usually referred to in the art as a PLD. It should be understood that the particular embodiment of the invention described herein is exemplary, and is described in detail to more clearly and fully depict the invention than would otherwise be possible; it is not meant to limit the invention to this particular embodiment. The optimizer according to the invention takes abstract expressions in a compiled language file, optimizes them, then converts them into physical representations that can be implemented in PLDs by commercially available tools. Every PLD 10 includes a set of inputs 12, an AND array 14, a set of OR gates 16, a set of macrocells or resources 18, and a set of outputs 20. The inputs generally include a clock input 11 and a set of generalized inputs 12A, 12B, etc. The generalized inputs 12A, 12B, etc. will be symbolized herein in the Boolean equations representing the PLD logic by the beginning letters of the alphabet, and are so labeled in the drawing. The generalized inputs 12A, 12B, etc, each include a driver with two outputs 22A and 22B. If a logic 1 signal is placed on the input, such as 12A, a logic 1 will be output by driver 22 on output 22A, and if a logic 0 signal is put on the input 12A, a logic 0 will be output on output 12B. The outputs, such as 22A and 22B, of all the drivers, such as 22, are applied to AND array 14. The AND array 14 comprises rows and columns of wires that may be disconnected by fusing. The outputs 15 of AND array 14 are connected to OR gates 16 and to macro cells 18. In the embodiment shown, each OR gate, such as 16A, has the same number of inputs, which is eight in the embodiment shown, however the number of inputs from gate to gate may vary in other embodiments and the invention will work well for such embodiments due to the distribution in equation sizes resulting from the optimizer according to the invention. The outputs 17 of OR gates 16 connect to macrocells 18. The outputs 20 of macrocells 18 provide the PLD outputs. The individual outputs 20A, 20B, etc. will be symbolized herein in the Boolean equations representing the PLD logic by the ending letters of the alphabet, and are so labeled in the drawing. Every PLD will have inputs 12, OR gates 16, macrocells 18, and outputs 20, though the number will vary widely, anywhere from a few to scores. The number of inputs 15 to each OR gate will also vary. Every PLD will also have an AND array, though the size may vary greatly. The logic components in each macrocell will also vary. In the PLD 10 shown in the drawing, one of most types of logic component that generally may be included in the macrocells of state-of-the-art PLDs is shown. Referring to macrocell 18A, these include an XOR gate 24, a fusible inverter which is implemented as a second XOR gate 26 with one input 27 grounded and a fusible wire 28 between the input 27 and ground, a register 30 which is shown as a D type flip-flop, an output inverting enable 32, and an node driver 34. Register 30 may also be a JK, SR, or T type flip-flop, and in the case of a JK and SR flip-flop, it would be fed by two inputs from the array 14. The interconnections of these logic components may vary, but typically would be as shown in FIG. 1. The inputs of XOR gate 24 connect to the outputs 15B and 17A of AND array 14 and OR gate 16A respectively. The output of XOR gate 24 connects to the input of XOR gate 26, and the output of XOR gate 26 connects to the D input of D flip-flop 30. The clock input 11 connects to the clock input of each of the registers, such as 30. The Q output of flip-flop 30 connects to the input of inverting enable 32 and the output of inverting enable 32 provides the PLD output 20A. The enable line 15A may be connected to the AND array 14 as shown, connected to an input 12, or to almost any other logic element in the circuit 10. The /Q output of flip-flop 30 provides the input to input driver 34, which has a logic 1 output 34A and a logic 0 output 34A, both of which connect to AND array 14. The driver 34 allows the output of macrocell 18A to be looped back to AND array 14. Thus macrocell 18A can be considered to be an internal node of the PLD. Using macrocell 18A as a node will result in output 20A not being available. Thus an internal node consumes a resource of the PLD.

Figure 2:
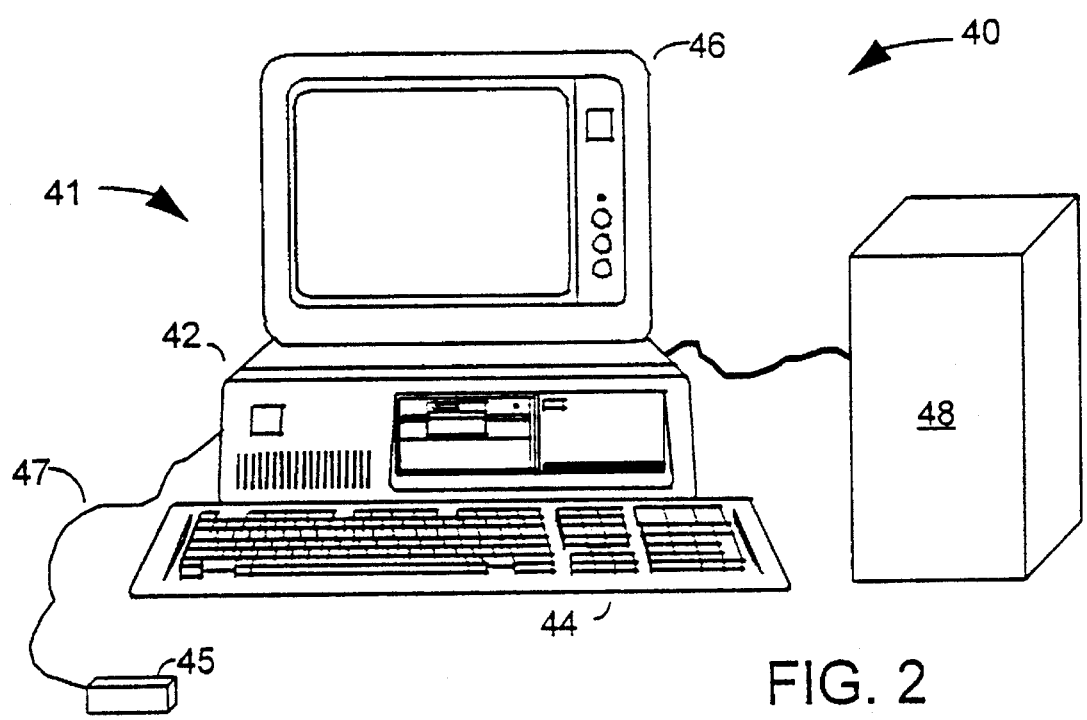
FIG. 2 shows an exemplary preferred embodiment of the computer-assisted logic design system according to the invention.

A example of the preferred system 40 according to the invention is shown in FIG. 2. System 40 comprises a computer 41 which includes computer assembly 42, keyboard 44, mouse 45, and display 46 interconnected by cables 47. Computer 41 may be almost any commercially available computer such as an IBM™ compatible PC or a SUN™ workstation. A PLD programmer 48 is connected to computer 41 via cable 49. PLD programmer may be any one of a large number of commercially available programmers. Data relating to the available PLDs, the logic design to be implemented, and the constraints desired by the user are input into computer 41, the software according to the invention determines the optimum PLD system, including both the particular PLDs to be used to implement the logic design and the programming of each individual PLD, and the PLD programmer 48 then automatically programs the PLDs by fusing wires designated by the software.

Figure 3:
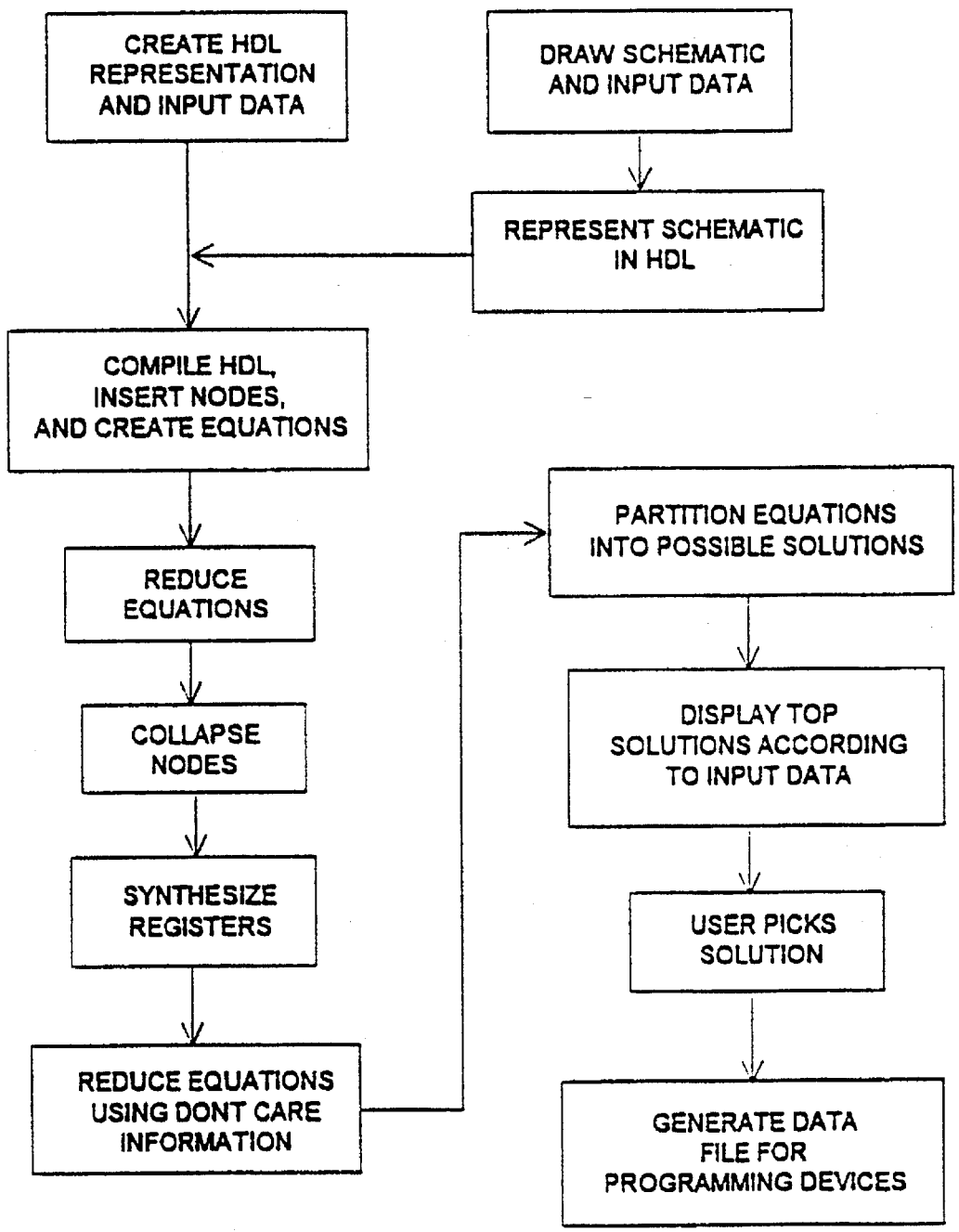
FIG. 3 is a flow chart of an exemplary preferred embodiment of the main program of a system according to the invention.

The main program 50 according to the invention is shown in FIG. 3. The purpose of this program 50 is to reduce the number of nodes and the size of the design equations and provide a wide variety of choices for implementing the design. Because PLDs implement logic using two-level logic feeding macrocells, such as 18 in FIG. 1, the equations feeding the inputs of the macrocells are represented in two level sum-of-product form. As described in United States patent application Ser. No. 07/782,288, which is hereby incorporated by reference, the software 50 includes extensive files on the details of almost every commercially available PLD. The details of the particular logic requirements of the design to be implemented may be input into the system 40 in several ways, preferably either via keyboard 44 and mouse 45 using a standard high level hardware description language (HDL), or via keyboard 44, mouse 45, and any one of many commercially available draw tool software programs to produce a schematic of the logic. In the latter case, the schematic is translated to a standard internal representation such as EDIF 2 0 0. by commercially available schematic software. This internal representation is then translated to HDL via a software module, such as those available from Minc, Incorporated. The software 50 then reads the HDL representation and inserts nodes in the Boolean equations while compiling them. The equations are then reduced to an equivalent set of equations having the minimum number of product terms, preferably via a program utilizing either the Espresso, Espresso Exact, or Quine-McClusky reduction algorithms. In this reduction, all DONT CARE information is retained. The nodes are then collapsed and the registers synthesized, as will be discussed in detail below. The resulting equations are again reduced, preferably using either the Espresso, Espresso Exact, or Quine-Mc-Clusky reduction algorithms in a final reduction using the DONT CARE information. The equations are then partitioned as described in U.S. patent application Ser. No. 07/782,288, the top ten solutions are displayed, the user picks one solution, and a data file is generated in a form readable by any PLD programmer 48. The data file lists the specific commercially PLDs used to implement the solution and the details of the wires to be fused to program them to create the desired design. Equation reduction algorithms, partitioning equations to arrive at solutions according to user input criteria, display and user selection of solutions, generation of the data files, and programming of the PLDs by the PLD programmers 48 are all known in the art, and therefore will not be discussed in detail herein.

The optimizer system 40 system according to the invention not only makes maximum use of PLD resources, but also results in greatly increased flexibility that permits implementations to be derived which could not be derived with prior art optimizers. For example, consider the logic system:

INPUT a,b,c,d;

OUTPUT x;

IF a*b THEN x=C;

ELSE x=d;

END IF.

Prior art systems would produce the following equation:

$x=a*b*c+/a*d+/b*d$.

However, if the target hardware could only handle up to two OR terms in an equation, then this equation could not be implemented. The technique of the invention would produce either:

$x=a*b*c+/a*d+/b*d;$ or:

$x=temp*c+/temp*d;$ $temp=a*b.$ depending on the constraints input at setup. The second form would be implementable in hardware that can handle only two OR terms by using two resources; one for x and one for temp. This is an simple example to illustrate the point. Typical hardware can handle 8 or more product terms (pterms).

2. Detailed Description of the Software

A. The Compiler

As discussed above, the compiler generates a list of declared symbols along with their associated equations. These equations are written in two level sum-of-products form using the Boolean operators "AND" represented as "*", "OR" represented as "+" and "NEGATE" represented as "/", operating on the signals of the logic design. For example, x=a*b+c is a two level sum-of-products form of the logic specification that the output x must be equal to the input a "AND'd" with the input b, and the resulting product OR'd with the input c. When possible, the compiler will also produce an exclusive-OR representation, which is in the form of an exclusive-OR gate fed by two sum-of-products equations. One may also use the normal arithmetic addition which we represent as .+., normal arithmetic subtraction which we represent as .−., the relational operators greater then, represented as >, less than, represented as < as well as other operators and statement constructs. These operators and statement constructs will be converted to the sum-of-products or exclusive-OR representations described above.

While devices vary in their flexibility of sharing hardware between macrocells, they are all constrained by the number of input signals that can drive an equation and the number of product terms (pterms) in an equation. There may be a number of equation pterms short of the hard limit that takes most efficient advantage of the architecture of the device. The goal of device specific optimization is to manipulate equations to take the maximum use of each resource without exceeding these limits. One optimization technique, which we will discuss below, is node collapsing. However, node collapsing will not be efficient if the equations are already in a collapsed form. That is, the factors that were implicit in the high level description may be lost. For example, consider the arithmetic sum of two eight digit numbers, i.e. A[8]=B[8] .+.C[8], which can be written:

| C7 | C6 | C5 | C4 | C3 | C2 | C1 | C0 |
|----|----|----|----|----|----|----|----|

+

| B7 | B6 | B5 | B4 | B3 | B2 | B1 | B0 |
|----|----|----|----|----|----|----|----|

=

| A7 | A6 | A5 | A4 | A3 | A2 | A1 | A0 |
|----|----|----|----|----|----|----|----|

The term A0 depends on just the terms B0 and C0. However, since there may be a carry term when C0 and B0 are added, the term A1 depends not only on C1 and B1, but also on C0 and B0. Further, since there also may be a carry term in adding C1 and B1, A2 depends not only on C2 and B2, but also on C1, B1, C0, and B0. Thus, the number of terms in the general equation for any arithmetic operation on digital numbers goes up exponentially with the number of digits. Since the number of inputs to OR gates in PLDs is often limited to on the order of eight or sixteen, collapsing a node containing an arithmetic addition of just two eight digit numbers would already make the equation two big to implement. Thus the compiler adds a node between each digit of arithmetically added numbers, i.e. A1= ADDCARRY0.+.C1.+.B1, where ADDCARRY0 is a node equal to the carry of C0.+.B0, and A2=ADDCARRY1.+ .C2.+.B2, where ADDCARRY1 is a node equal to the carry of ADDCARRY0.+.C1.+.B1. etc. Thus no equation has more than four terms as a result of mapping the arithmetic expression to the sum-of-products representation.

Figure 4:
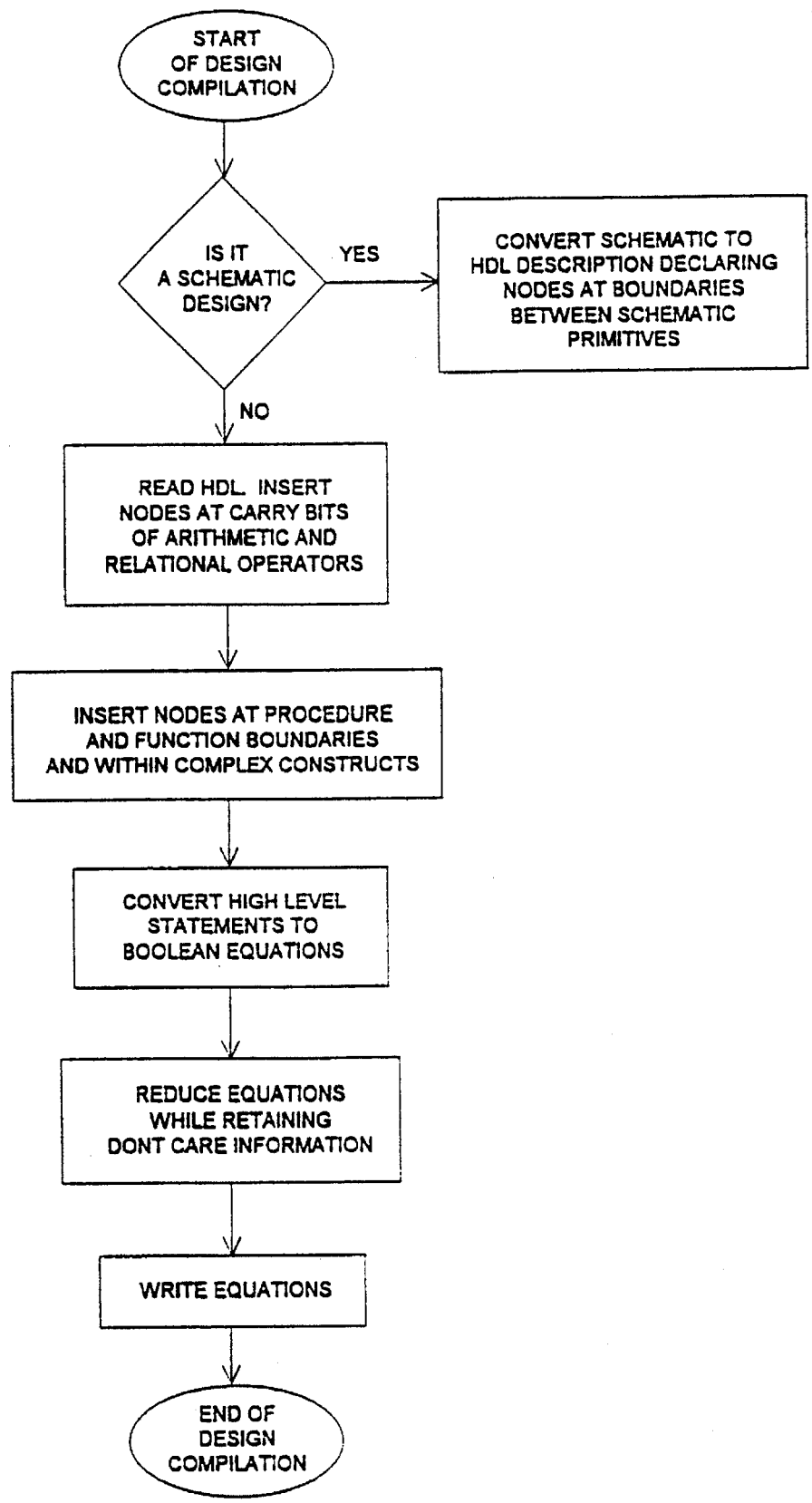
FIG. 4 is a flow chart of the compiler subprogram of the embodiment of FIG. 3.

Turning to FIG. 4, a flow chart of the compilation process is shown. The compiler first checks to see if the input is via schematic, and if it is, it converts the schematic to the HDL description while declaring nodes at boundaries between schematic primitives. It then reads the HDL, or if the input was in terms of HDL, it reads it directly, skipping the schematic conversion. Then the compiler inserts nodes at the carry bits of arithmetic and relational operators, as discussed above.

Likewise the compiler creates nodes in other areas where there are implicit nodes in either the HDL language or schematic design. As stated above, for a schematic design, a node exists at least at every boundary between schematic primitives. Thus nodes will be placed at all such boundaries. Nodes may also exist internally to the primitives as well. The compiler recognizes such primitives which have internal nodes and places the nodes appropriately. For a language design, nodes are placed at the boundaries of hierarchical instantiations of FUNCTIONs and PROCEDUREs. Such boundaries correspond to the inputs and outputs of logic elements that can be quite complex, and therefore could be represented by large equations. Collapsing of such nodes could lead to exponential growth of equations as in the case of arithmetic operations, described above, which the introduction of nodes prevents. Other statement constructs in HDL language, such as complicated IF statements, may also have implicit nodes, and the compiler thus places a node at each expression used in a complex statement construct.

The insertion of nodes permits the optimization system of the invention to handle equations involving arithmetic operation on operators having many more bits that was possible with the prior art. It also permits the designer to organize the design in a manner that makes sense to the designer without being forced to tailor the design to the target hardware.

It should be understood that nodes could also be added in other ways. For example, one could substitute a node for every product of three terms; or for every product of four terms. Or one could declare a node only for the carry of every third bit, instead of every bit. The use of node collapsing, however, permits the creation of nodes at many more points, since the nodes that do not create too large of equations will be collapsed. The placing of nodes at all of the points discussed above creates great flexibility in the collapsing process.

The compiler then converts the high level statements to Boolean equations in the form discussed above. After the equations are compiled, they are reduced using one of the reduction algorithms mentioned above, however, the node points are retained in the equations to leave the equations small, giving the node removal process greater flexibility to choose which nodes to leave and which to remove. The compiler then writes the equations and stores them.

B. Node Collapsing

One of the techniques used to achieve the optimization goal is the process of removing an internal node and substituting its equation into the equations that reference it. This is called node collapsing. As an example, consider the following example:

x=a*b+c;

y=x*d;

z=x+b.

Collapsing the node "x" yields:

y=a*b*d+c*d;

z=c+b.

Note that in the equation for z, the a*b term reduced out.

From the above example, it is clear that node collapsing reduces the number of equations. Thus it reduces the number of resources needed to implement the equations. However, it also can increase the number of terms in some equations, and if any equation becomes too big, then there may not be sufficient logic per resource to implement it. Therefore the collapsing is guided by five different parameters related to the logic available.

The first equation constraint parameter is MAX SYMBOLS, which is a user input number which specifies the maximum number of unique signals allowed in a single equation. The default value of MAX Symbols is 20. As indicated above, the symbols in an equation correspond to inputs 12, nodes that feed into the AND array 14, and anything else that feeds into the array. Thus, the user may set this equal to the maximum number of inputs and nodes that feed the array. However, it may be that the user knows that there will only be a few outputs in an implementation, and, as indicated above, outputs can be used as inputs in some devices. Thus the user may increase MAX SYMBOLS in such a case. Or, it is known that outputs will be at a premium, the user may want to decrease the MAX SYMBOLS parameter. Experience with the optimizer and PLDs result in the user being able to adjust the MAX SYMBOLS parameter, as well as other parameters discussed below, to target the user's preferences.

The second user-input equation constraint parameter is MAX PTERMS, which is a user input number specifying the maximum number of product terms allowed in the sum-of-products representation of an equation. The default value of MAX PTERMS is 16. In general this term corresponds to the number of inputs 15 to the OR gates 16, however, it too may be influenced by the use of other components of the logic 10, and experience helps the user set it appropriately.

The third user-input equation constraint parameter is POLARITY CONTROL, which is designated by the user as either TRUE or FALSE. POLARITY CONTROL indicates whether or not the targeted device has a fusible inverter to control the polarity of input to the register 30, or in terms of the Boolean representation, the polarity of the sum-of-products equation. If POLARITY CONTROL is TRUE, that is, if polarity control is present in the target device, then either the original equation or its DeMorgan equivalent, sometimes called the complement, can be used. The equation will be judged by the smaller of the two representations. If POLARITY CONTROL is FALSE, that is, if polarity control is not present in the target device, then the use of one representation may be forced to achieve the correct polarity for the signal. Thus, in this case, the equation is then judged by the larger of the two representations. The default setting is TRUE.

The fourth user-input equation constraint parameter is MAX XOR PTERMS, which is a number specifying the maximum number of product terms allowed in an equation feeding one half of an exclusive OR, assuming the other half has one pterm. This situation is common to many device architectures. If the exclusive-OR representation of an equation has more than a single pterm on both sides then the equation will exceed the MAX PTERMS constraint. If either the regular product terms constraint or the exclusive-OR product terms constraint is met then an equation is acceptable. Thus, fusible exclusive-OR gates are well supported by allowing the most efficient form of the equation to be used. The default value of MAX XOR PTERMS is 0, which assumes that the target hardware does not have an exclusive-OR gate.

The fifth user-input equation constraint parameter is XOR POLARITY CONTROL, which is specified as either TRUE or FALSE. XOR POLARITY CONTROL specifies whether or not the targeted device has a fusible inverter on its exclusive-or gate to control its polarity. If XOR POLARITY CONTROL is TRUE, that is, if polarity control is present on the exclusive OR in the target device, then either the original equation feeding the XOR gate or its DeMorgan equivalent can be used. The equation will be judged by the smaller of the two representations. If XOR POLARITY CONTROL is FALSE, that is, if polarity control is not present on the exclusive OR in the target device, then the use of one representation may be forced to achieve the correct polarity for the signal. Thus, in this case, the equation is then judged by the larger of the two representations. The default value of XOR POLARITY CONTROL is FALSE.

There is also the following special case: if the one pterm side of the XOR is a single symbol, then the XOR equation is judged by the smaller of the original equation or its DeMorgan regardless of the value of XOR POLARITY CONTROL. This is because the ON and OFF representations of the single symbol equation both have a single pterm, giving the automatic partitioning tools the freedom to choose either one to maintain the correct polarity.

The above parameters can be tailored to the needs of each target device. As in other optimizer systems, the parameters are preferably input into a data file as signal properties during the step 52A or 52B (FIG. 3). These properties are preferably input on a device by device basis since the correct values are different for different target devices.

A simple example will illustrate the application of the above constraints, before we continue on other controls on node collapsing. Consider the following logic system:

INPUT a,b,c,d,e;
NODE x;
OUTPUT out;
x=c*(d+e);
out=(a*b)(+)x.

If "x" were to be collapsed then the exclusive-or representation of "out" is:

$$out=(a*b)(+)(c*d+c*e)$$

and non-exclusive-or representation of "out" is:

$$out=c*d*/a+c*d*/b+c*e*/a+c*e*/b+a*b*/c+ a*b*/d*/e.$$

If MAX PTERMS≧6 or MAX XOR PTERMS≧2 then "x" will be collapsed. For the sake of simplicity, in this example we have ignored the polarity control properties and the DeMorgan versions of each equation, which would also be considered in the actual determination of whether or not to collapse.

The above paragraphs described how to control the node collapsing process using the properties or the equations resulting from collapsing each node. It is also possible to explicitly control the collapsing of individual nodes by declaring them to be VIRTUAL or PHYSICAL. VIRTUAL nodes are always collapsed. PHYSICAL nodes are never collapsed. A node can be declared to be VIRTUAL or PHYSICAL in the source file created in steps 52A and 52B (FIG. 3).

Any node declared with control equations, i.e. CLOCK, RESET, PRESET, and ENABLE, in the source file will become PHYSICAL since, if a node has properties attached to it, it must physically exist.

During the collapsing process, nodes may be made PHYSICAL in order to proceed with further collapsing. These nodes will be implemented in the PLD device.

Prior to collapsing, any unused node is removed. That is, if a node is not referenced in any equation that ultimately feeds an output, then it does not contribute to the value of any output. Therefore it represents superfluous logic, and is removed.

Any node for which the equation is a single symbol is collapsed at the initiation of the node collapse procedure, since this does not increase the size of any equation.

Any node that is referenced in a control equation, i.e., CLOCK, RESET, ENABLE, PRESET, and CLOCK ENABLE, is not collapsed unless it is declared to be VIRTUAL. This is because the equation properties for node collapsing apply to the data equation of a node and not to the control equations. For example, consider the HDL description:

INPUT clk, reset1, reset2, a,b;
NODE reset;
OUTPUT out CLOCKED BY clk RESET BY reset;
reset=reset1*reset2;
out=a+b.

The node "reset" will not be collapsed since it is used in the RESET BY equation of the signal "out". If it had been collapsed then this design would not have fit into many devices that have a single reset line. Declaring "reset" to be VIRTUAL would cause it to be collapsed anyway.

Combinatorial feedback nodes, that is, nodes that reference one another to create a circular feedback loop, are also removed whenever possible. As will be seen in detail in the discussion of the node collapse software below, a heuristic is employed to remove as many nodes involved in combinatorial feedback as possible. However, if the optimizer determines that the combinatorial feedback node is required by the feedback circuit, then that node is not removed. As an example, consider the following design:

INPUT a, b, c;
NODE y, x;
OUTPUT out.
y=a(+)x;
x=y*b;
out=x*c.

Collapsing the node x produces the following equations:

y=a(+)(y*b);
out=y*b*c.

Because the equation for the node y contains y as one of the inputs, the node y cannot be collapsed. Thus the program will make this node PHYSICAL.

Figure 5A:
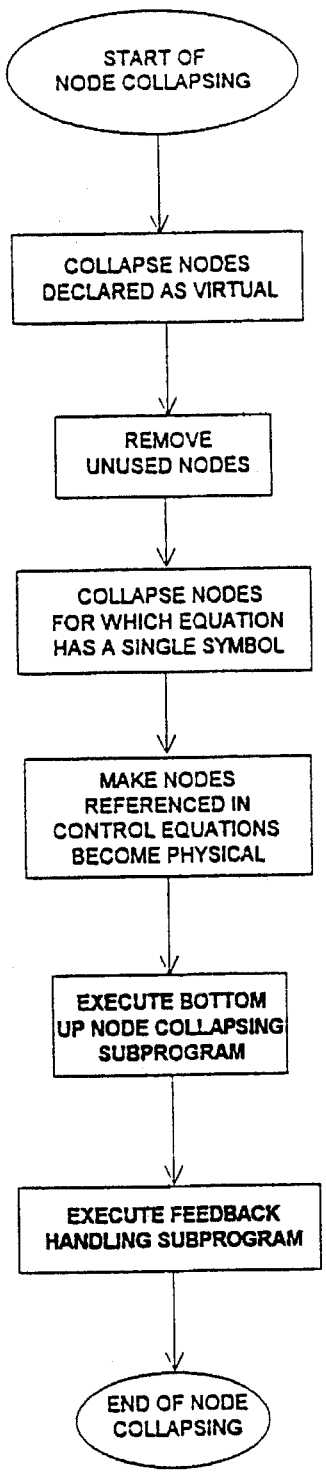
FIGS. 5A through 5E are flow charts of the optimizer program of the embodiment of FIG. 3.

With the above background, the flow chart of the software program to collapse the nodes, shown in FIGS. 5A through 5F, can understood. Though not expressly shown, it should be understood that each time a node is collapsed and new equations are obtained, they are reduced. Turning to FIG. 5A, first the nodes declared as VIRTUAL are collapsed. Then unused nodes are removed, and nodes for which the equation is a single symbol are removed. Then the control equations, i.e. CLOCK, RESET, ENABLE, PRESET, and CLOCK ENABLE are found and any nodes referenced in these equations are made PHYSICAL so the control equations will not become larger. Then the bottom up node collapse step is performed, as will be described in detail below, and finally a combinatorial feedback handling step is performed, which also is described in detail below.

Figure 5B:
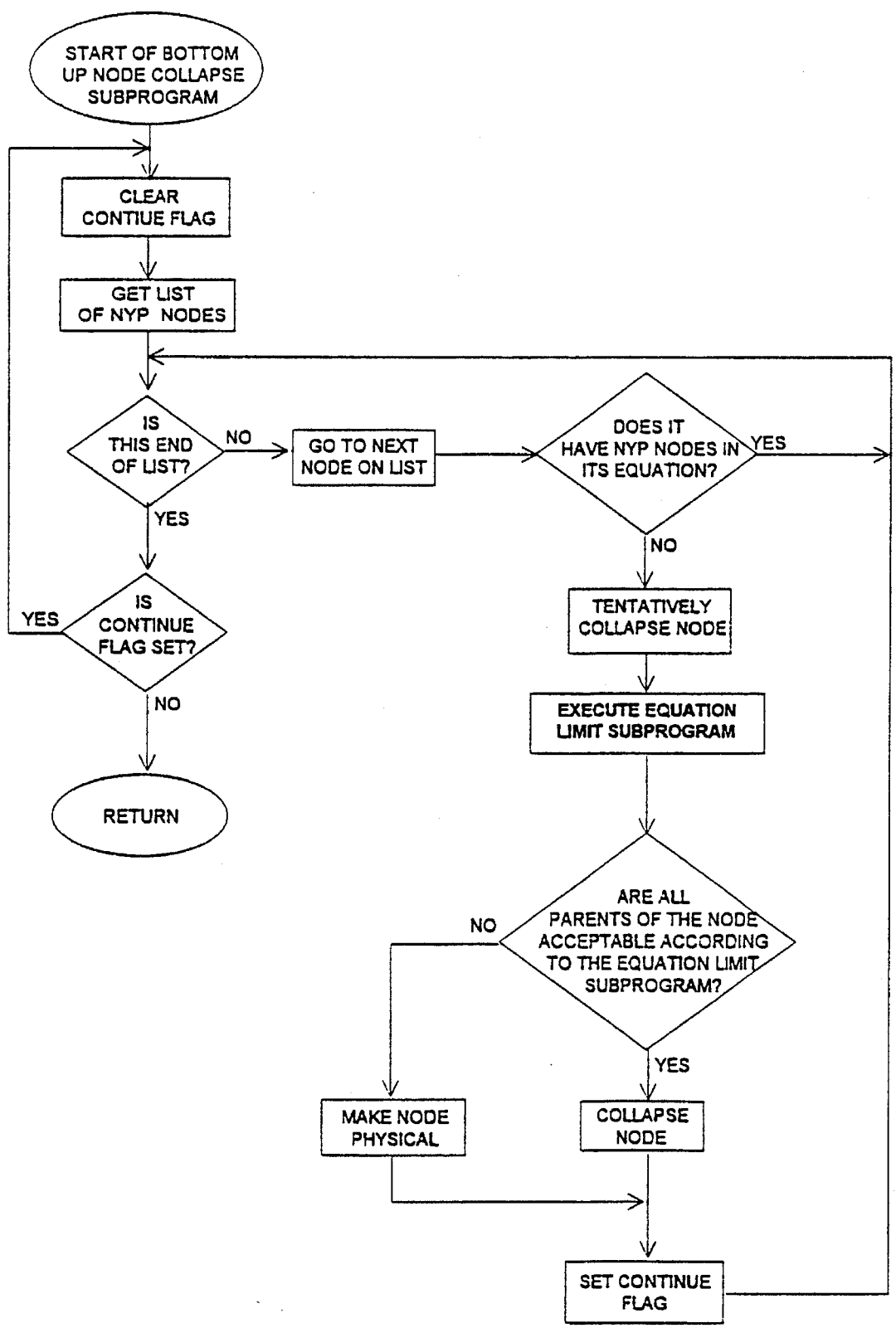
Figure 5C:
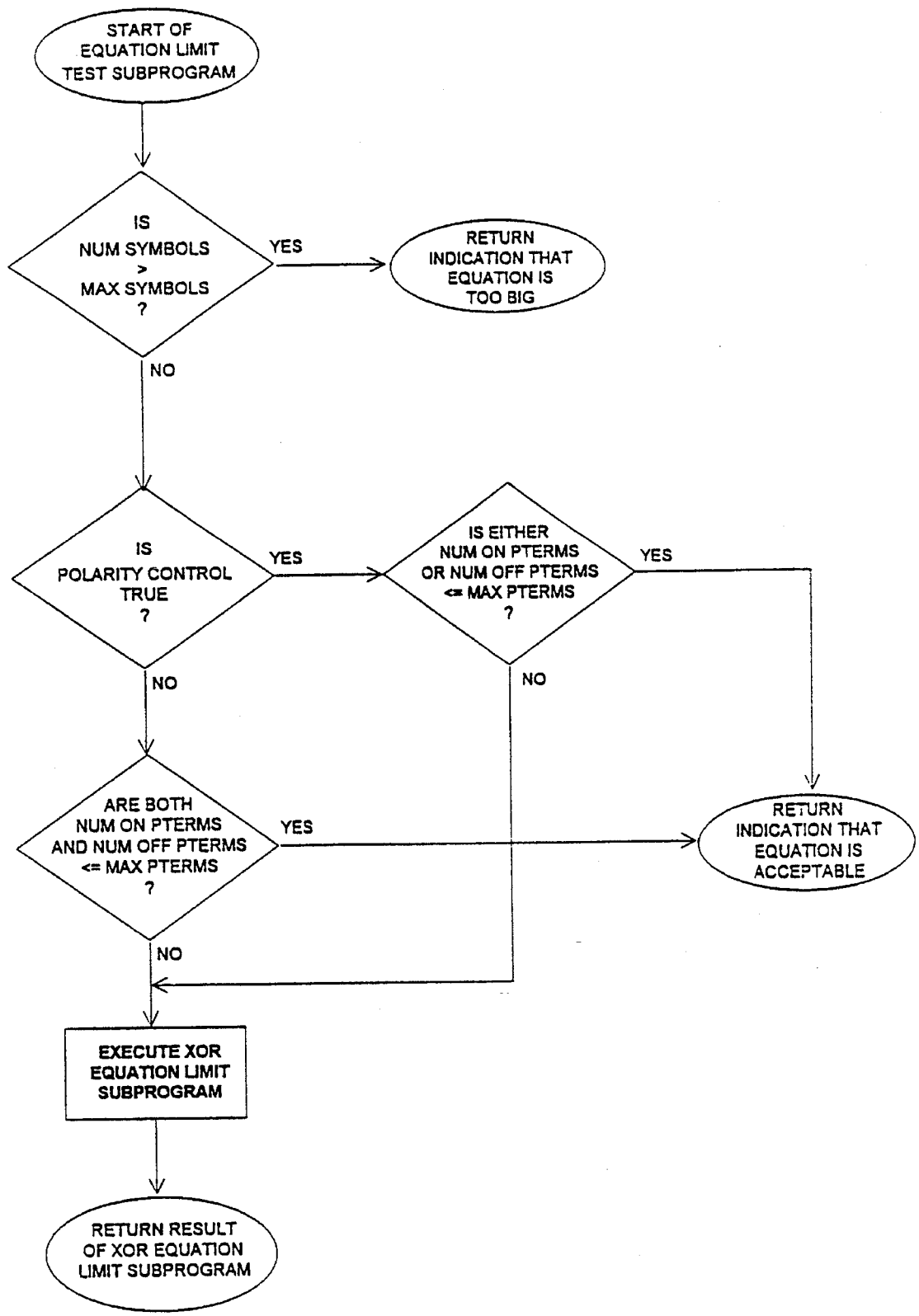

Next we turn to the start of the bottom up node collapsing step shown in FIG. 5B. As shall become evident from the flow chart, the continue flag is a flag which tells the program whether a node that does not have any other nodes in its equation was found in the last iteration, so that another iteration is needed. First the program clears the continue flag if it is set, gets the list of nodes that have not been made physical, which we shall call the not-yet-physical nodes, abbreviated, NYP nodes. If the program is not at the end of the list, it goes to the next node on the list, which will be the first node, the first time around. The program checks to see if the equation includes other NYP nodes, and if it does, it loops back to the list and goes to the next node. This causes the nodes to be processed in a "bottom up" order, that is, starting with the nodes that do not reference other nodes. If the equation does not include other NYP nodes, the node is tentatively collapsed, and the each of the parent equations of the node, i.e. the equations the node is collapsed into, are tested in the subprogram to test whether the equation limits are met by the parent equations of the node. This equation limit test program is shown in FIG. 5C and will be discussed in detail below. If all of the parent equations of the node are acceptable according to the equation limit subprogram, the node is collapsed, and if any of the equations are not acceptable, the node is made physical and taken off the list of NYP nodes. Then the continue flag is set, and the subprogram returns to the list and goes on to the next node if the end of the list has not been reached. If the continue flag is set when the end of the list is reached, this means that a node has been made physical or collapsed since the list was started. In this case, other nodes that have already been reviewed and discarded as having other NYP nodes in them, may now no longer have NYP nodes in them, and therefore the program goes back and clears the continue flag and gets the list and starts through it again. If the continue flag is not set, that means the entire list has been gone through without finding a node that does not have NYP nodes in its equation, and therefore all the NYP nodes that are left are in one or more combinatorial feedback loops. The program then exits to the node collapse program (FIG. 5A) which goes to the feedback handling subprogram.

Figure 5D:
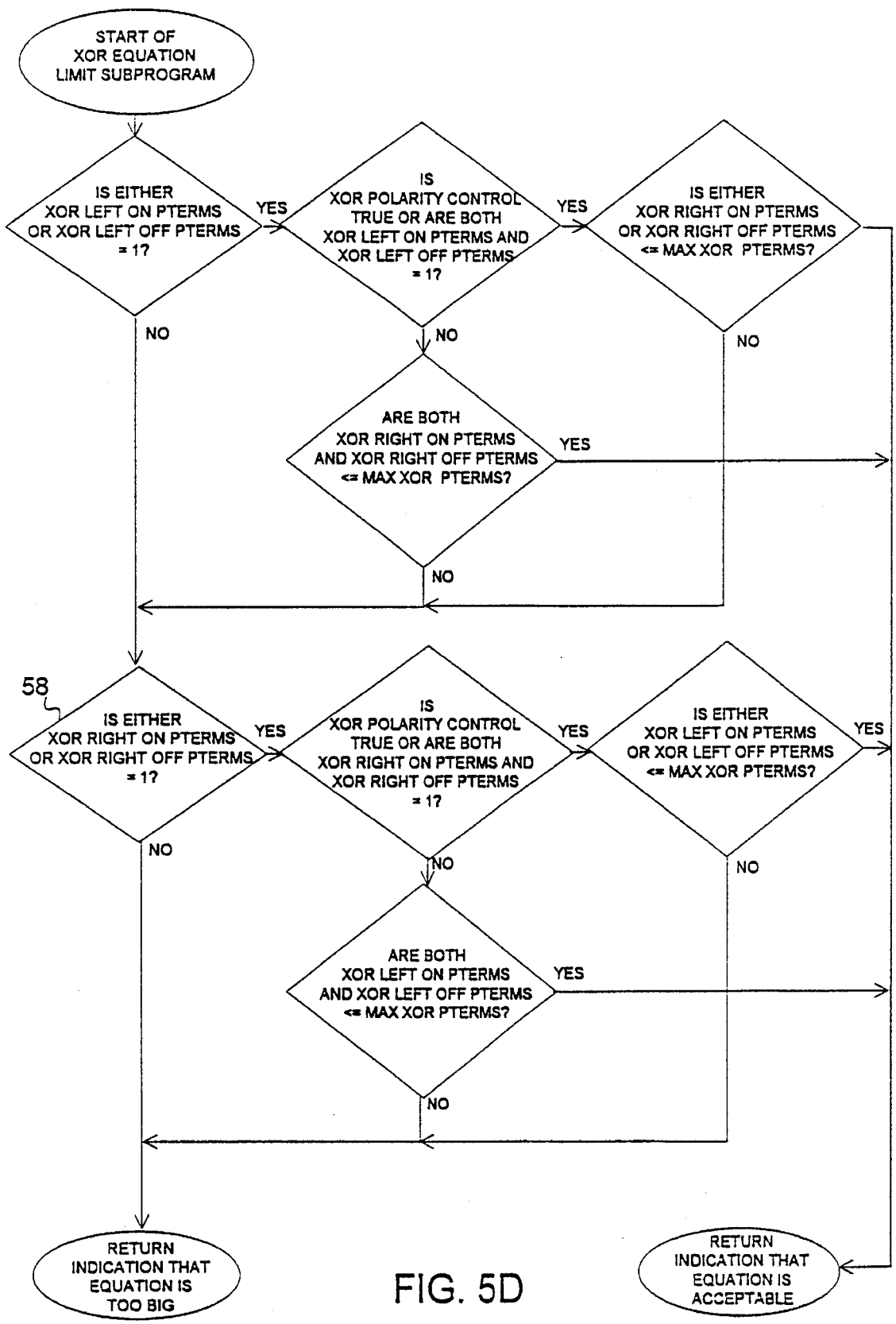

We now turn to the equation limit test subprogram shown in FIG. 5C and the XOR equation limit subprogram as shown in FIG. 5D. These subprograms test each parent equation against the five constraints discussed above. In evaluating the equations against the constraints the following terms are useful:

NUM ON PTERMS: number of product terms in the ON polarity version of the sum-of-products representation of the equation;

NUM OFF PTERMS: number of product terms in the OFF polarity version of the sum-of-products representation of the equation;

NUM XOR LEFT ON PTERMS: number of product terms in the ON polarity version of the left side of the exclusive-or representation of the equation;

NUM XOR LEFT OFF PTERMS: number of product terms in the OFF polarity version of the left side of the exclusive-or representation of the equation;

NUM XOR RIGHT ON PTERMS: number of product terms in the ON polarity version of the right side of the exclusive-or representation of the equation;

NUM XOR RIGHT OFF PTERMS: number of product terms in the OFF polarity version of the right side of the exclusive-or representation of the equation;

The equation limit test subprogram in FIG. 5C first tests whether the number of symbols in the equation is greater than the MAX SYMBOLS parameter. If it is, then the subprogram is immediately terminated and the subprogram returns an indication that the equation is to big, which would result in the node being made physical. If the number of symbols is not greater than the MAX SYMBOLS parameter, then the equation limit test subprogram and the XOR equation limit subprogram together test whether each parent equation meet any of the following conditions:

POLARITY CONTROL is true and either NUM ON PTERMS or NUM OFF PTERMS is less than or equal to MAX PTERMS;

POLARITY CONTROL is false and both NUM ON PTERMS and NUM OFF PTERMS are less than or equal to MAX PTERMS;

Both NUM XOR LEFT ON PTERMS and NUM XOR LEFT OFF PTERMS is equal to 1 and XOR POLARITY CONTROL is true and either NUM XOR RIGHT ON PTERMS or NUM XOR RIGHT OFF PTERMS is less than or equal to MAX XOR PTERMS;

Either NUM XOR LEFT ON PTERMS or NUM XOR LEFT OFF PTERMS is equal to 1 and XOR POLARITY CONTROL is false and both NUM XOR RIGHT ON PTERMS and NUM XOR RIGHT OFF PTERMS are less than or equal to MAX XOR PTERMS;

Both NUM XOR RIGHT ON PTERMS and NUM XOR RIGHT OFF PTERMS are equal to 1 and either NUM XOR LEFT ON PTERMS or NUM XOR LEFT OFF PTERMS is less than or equal to MAX XOR PTERMS;

Either NUM XOR RIGHT ON PTERMS or NUM XOR RIGHT OFF PTERMS is equal to 1 and XOR POLARITY CONTROL is true and either NUM XOR LEFT ON PTERMS or NUM XOR LEFT OFF PTERMS is less than or equal to MAX XOR PTERMS;

Either NUM XOR RIGHT ON PTERMS or NUM XOR RIGHT OFF PTERMS is equal to 1 and XOR POLARITY CONTROL is false and both NUM XOR LEFT ON PTERMS and NUM XOR LEFT OFF PTERMS are less than or equal to MAX XOR PTERMS.

If any of the above conditions is met, the equation is considered acceptable, and a return indication that the equation is acceptable is made. If all the parent equations meet at least one of the above conditions, then the node is collapsed in the bottom up node collapse subprogram. However, if any parent equation fails all of the above tests, it is not acceptable, and the node is made PHYSICAL in the bottom up node collapse subprogram.

Turning first to the equation limit test subprogram as shown in FIG. 5C, as indicated above this subprogram examines each of the parent equations of nodes that have been tentatively collapsed in the bottom up node collapse subprogram. First the subprogram tests whether the number of symbols in the equation is greater than the MAX SYMBOLS parameter. If it is, then the subprogram is immediately terminated and the subprogram returns an indication that the equation is to big, which would result in the node being made physical. If the number of symbols is not greater than the MAX SYMBOLS parameter, then the subprogram checks to see if the polarity is TRUE. If it is TRUE, the program checks to see if either the number of ON pterms or the number of OFF pterms is less than or equal to the MAX PTERMS parameter. If either is so, then the subprogram returns an indication that parent equation is acceptable. If the POLARITY CONTROL is not true, then the program checks to see if both the number of ON pterms and the number of OFF pterms are less than or equal to the MAX PTERMS parameter. If both are, the subprogram returns an indication that the parent equation is acceptable. If either the number of ON pterms or the number of OFF pterms is greater than the MAX PTERMS parameter, then the program goes to the XOR equation limit subprogram and tests the equation in that subprogram also.

The XOR equation limit subprogram is shown in FIG. 5D. The subprogram first examines if either the number of XOR LEFT ON pterms or the number of XOR LEFT OFF pterms is equal to one. If neither is, the subprogram goes to check condition 58. However, if either is, then the subprogram checks whether either the XOR POLARITY CONTROL parameter is TRUE or both the number of XOR LEFT ON pterms and the number of XOR LEFT OFF pterms are equal to one. If either condition is met, then the program examines if either the number of XOR RIGHT ON pterms or the number of XOR RIGHT OFF pterms is less than or equal to the MAX XOR PTERMS parameter, and if either is true, then the subprogram returns an indication that the equation is acceptable. If both are greater than the MAX XOR PTERMS parameter, then the program goes to condition 58. If neither the XOR POLARITY CONTROL parameter was TRUE or both the number of XOR LEFT ON pterms and the number of XOR LEFT OFF pterms were equal to one, then the subprogram checks whether both the number of XOR RIGHT ON pterms and the number of XOR RIGHT OFF pterms are less than or equal to the MAX XOR PTERMS parameter. If both are, then the subprogram returns an indication that the parent equation is acceptable; however, if either is greater than the MAX XOR PTERMS parameter, then the program checks condition 58.

If the subprogram passes to condition 58 after checking any of the above conditions, then the subprogram checks to see if either the number of XOR RIGHT ON pterms or the number of XOR RIGHT OFF pterms is equal to one. If neither is, the subprogram returns and indication that the equation is too big, and the node is made physical. However, if either is equal to one, then the subprogram checks if either the XOR POLARITY CONTROL parameter is TRUE or both the number of XOR RIGHT ON pterms and the number of XOR RIGHT OFF PTERMS is equal to one. If either is true, then the subprogram checks to see if either the number of XOR LEFT ON pterms or the number of XOR LEFT OFF pterms is less than or equal to the MAX XOR PTERMS parameter. If either is, the subprogram returns an indication that the parent equation is acceptable, but if both are greater than the MAX XOR PTERMS parameter, then the subprogram returns an indication that the equation is too big and the node will be made physical. If neither the XOR POLARITY CONTROL parameter was TRUE nor both the number of XOR RIGHT ON pterms and the number of XOR RIGHT OFF PTERMS was equal to one, then the subprogram checks to see if whether both the number of XOR LEFT ON pterms and the number of XOR LEFT OFF pterms are less than or equal to the MAX XOR PTERMS parameter. If both are, then the subprogram returns an indication that the parent equation is acceptable, however if either is greater than the MAX XOR PTERMS parameter, then the subprogram returns and indication that the equation is too big and the node will be made physical.

Figure 5E:
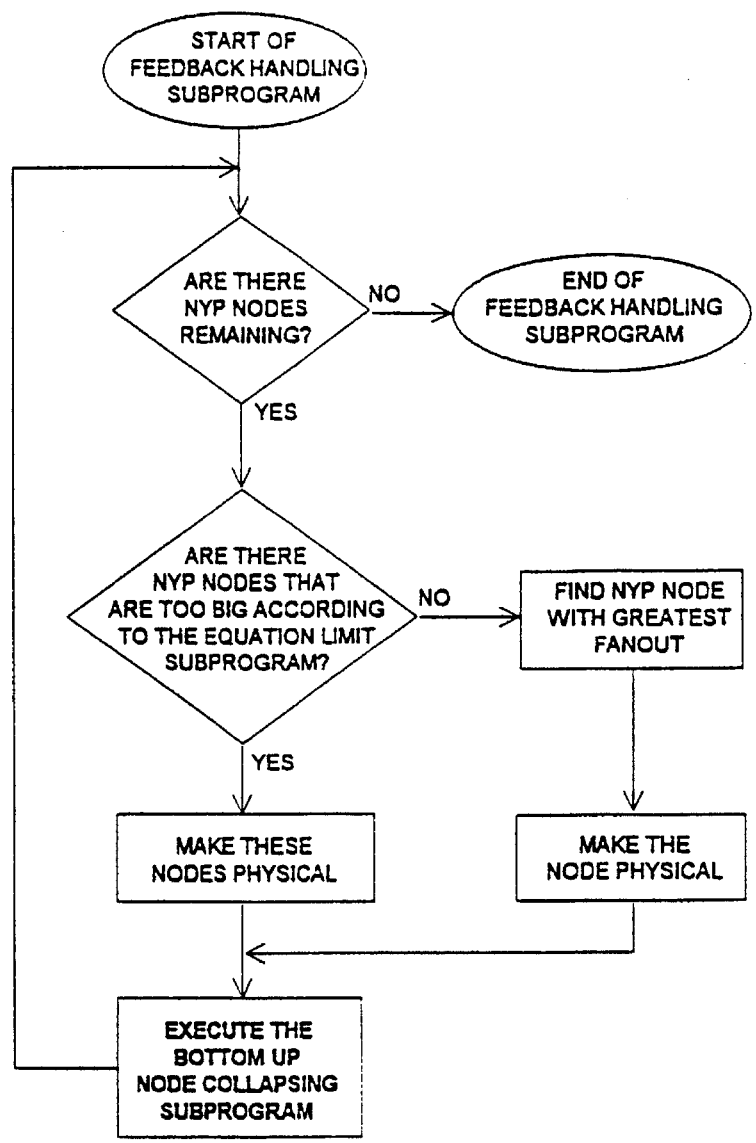
Figure 6:
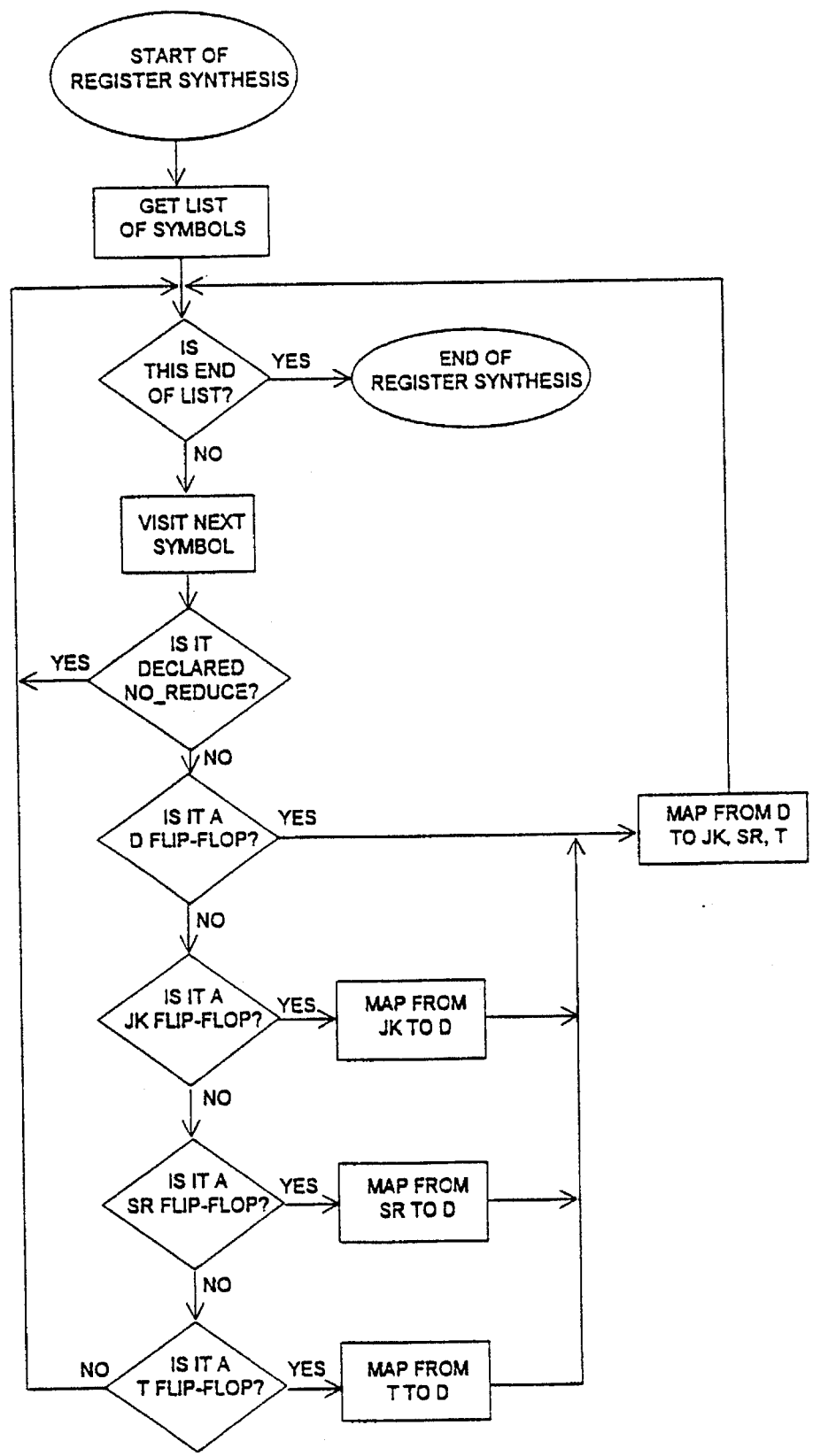
FIG. 6 shows a flow chart of the preferred register synthesis program according to the invention.

Turning now to the feedback handling subprogram shown in FIG. 5E, as indicated above, the program goes to this subprogram when it completes the bottom up node collapse subprogram and returns to the main node collapse program. The feedback handling subprogram first checks to see if there are any NYP nodes remaining. If there are, that means that the nodes are all in one or more combinatorial feedback loops. To break up a loop, the program first checks to see if there are any NYP nodes that are too big according to the equation limit subprogram. It is possible that some equations that are too large were included in the initial input of the equations by a user. If there are such nodes, they are made physical and the program again executes the bottom up node collapsing subprogram, since the making physical of these nodes may have broken one or more feedback loops. If there are any NYP nodes remaining when the subprogram returns to the start of the feedback handling subprogram, the subprogram then finds the NYP node with the greatest fanout, that is the node that is referenced by the greatest number of equations. It then makes this node physical and removes it from the list of NYP nodes. Since this may have broken one or more feedback loops, the program again executes the bottom up node collapsing subprogram, then returns to the feedback handling subprogram when through. When there are no longer any nodes remaining, the program ends the feedback handling subprogram and the node collapsing program (FIG. 5A) is at an end, and the returns to the main program (FIG. 3) and goes on to the register synthesis program (FIG. 6).

The equations that result from node collapsing will tend to have a distribution of sizes up to the specified limits. The limits typically can be set to match the characteristics of the largest equation able to be handled and good results will be achieved.

When directed partitioning is being performed, the type of device that each signal will be fit into is specified. In this case, the node collapsing constraints can be specified on a device by device basis to produce equation sizes tailored to each device.

When automatic partitioning is being performed, the designer may prefer to use a particular set of devices for a design. In this case, setting the node collapsing constraints to that required by the largest of these devices gives good results.

Even if the type of devices are unknown, approximate constraint values will still yield good results. The default values give good results for a wide variety of devices. A little experimentation with the constraints can help to refine the resulting equation sizes.

C. Register Synthesis

Register synthesis is another technique, in addition to node collapsing, which permits the optimization of the design for the largest variety of target devices. This technique synthesizes the equations for alternate flip-flop types for registers. The register type declared in the HDL source file allows the equations for a register to be expressed in terms of the given flip-flop type. The optimizer synthesizes the equations for other flip-flop types to give the automatic fitting process greater flexibility in its choice of devices in which to implement a register. As a simple example, given the following HDL source file:

INPUT a, b, clk;

OUTPUT x CLOCKED BY clk x=x(+)(a+b);

the resulting equations after optimization and synthesis would be:

.xori=x

.rorr=a+b

.d=a*/x+b*/x+.a*/b

.j=a+b

.k=a+b

.r=a*x+b*x

.s=a*/x+b*/x

.t=a+b

This gives the automatic partitioning tools described in the McDermith patent application the option of selecting between five different register implementations, which greatly increases the opportunities for compatibility with other circuit elements, availability, cost savings, etc.

If a register is declared with the NO REDUCE modifier then it will be implemented using the declared flip-flop type. No synthesis will be done.

The register synthesis mapping is from every flip-flop type to every other flip-flop type. This is done by mapping from each flip-flop type to the D flip-flop type and then from the D flip-flop type to every other flip-flop type. The mapping is given by the following equations in which "d" represents the equation feeding a D flip-flop, "j" represents the equation feeding the J input of a JK flip-flop, "k" represents the equation feeding the K input of JK flip-flop, "s" represents the equation feeding the S input of SR flip-flop, "r" represents the equation feeding the R input of a SR flip-flop, "t" represents the equation feeding a T flip-flop, and "q" represents the value driven out of the flip-flop:

Mapping from JK to D:

d.on=j.on*q.off+k.off*q.on d.off=j.off*q.off+k.on*q.on;

Mapping from SR to D:

d.on=(s.on*q.off+r.off*q.on)*(s.off+ r.off)

d.off=(s.off*q.off+r.on*q.on)*(s.off+ r.off);

Mapping from T to D:

d.on=t.on*q.off+t.off*q.on d.off=t.on*q.on+t.off*q.off;

Mapping from D to JK:

j.on=d.on*q.off j.off=d.off*q.off k.on=d.off*q.on k.off=d.on*q.on;

Mapping from D to SR:

s.on=d.on*(d.off+q.off)

s.off=d.off*(d.off+q.off)

r.on=d.off*(d.on+q.on)

r.off=d.on*(d.on+q.on);

Mapping from D to T:

t.on=d.on*q.off+d.off*q.on t.off=d.on&q.on+d.off*q.off.

Each equation has ON, OFF, and DONT CARE information. The equations describe the operations on the ON and OFF sets. The DONT CARE set is always equal to whatever is not covered by the ON and OFF sets.

FIG. 6 shows a flow chart of the preferred embodiment of the subprogram for performing the register synthesis. First the program gets the list of symbols. After checking whether it is the end of the list, it visits the next symbol, which will be the first symbol the first time through. If the symbol has a NO REDUCE modifier associated with it, the program will return to the list to check if it is the end of the list and then visit the next symbol. If the equation for the symbol was described in terms of a D-flip flop, the software applies the above transformations from D to the other flip-flops. If the equation was described in terms of a JK, SR, or T flip- flop, the software first transforms the equation to the D flip-flop representation before transforming to the other types. After the entire list of symbols have been visited and transformed, the software returns to the main program.

The register synthesis has especial value when combined with the automatic partitioning program described in United States patent application Ser. No. 07/782,288. The register synthesis generalizes the logic so that the automatic partitioning can be done with increased flexibility and make a more effective selection of devices.

D. Retention of DONT CARE Information

As indicated above, the compiler expresses each equation in terms of both its ON equation and OFF equation. The DONT CARE information is whatever is not included in the On and OFF equations. Any Boolean operation can be implemented in terms of the operators "AND" symbolized by *, "OR" symbolized by +, and "NEGATE" symbolized by /. The implementation of those operations on the ON and OFF sets is described by the following for each of these operators:

The equation:

$$x=a*b$$

in terms of ON and OFF sets is:

x.on=a.on*b.on x.off=a.off+b.off;

The equation:

$$x=a+b$$

in terms of ON and OFF sets is:

x.on=a.on+b.on x.off=a.off*b.off

The equation:

$$x=/a$$

in terms of ON and OFF sets is:

x.on=a.off x.off=a.on.

The DONT CARE set is always equal to whatever is not covered by the ON and OFF sets.

During the node collapsing and register synthesis steps, representations of the ON, OFF, and DONT CARE sets for each signal are maintained. The ON set is the set of conditions where the signal must be a 1. The OFF set is the set of conditions where the signal must be a 0. The DONT CARE set is the set of conditions where the system can choose either 0 or 1 for a signal in order to minimize equations.

After node collapsing and register synthesis are complete, equation reduction is performed. This final reduction takes advantage of the DONT CARE information to best minimize equation size within the context of the final equation. As indicated above, reductions that do not take advantage of DONT CARE information are done throughout the optimization process to keep equations small. It is important that using the DONT CARE information is postponed until the final reduction so that the DONT CARE information is used in a manner appropriate to the final form of the equations. If this DONT CARE reduction had occurred earlier, then the DONT CARE information would have been used nonoptimally.

In the preferred embodiment, there are three final reduction algorithms available: Espresso, Espresso Exact, and Quine-McClusky, although others may be used also. The method used is selectable from the optimizer command line via a software switch. The default method is Espresso. The Espresso algorithm is the fastest method and usually produces results as good as the other two algorithms.

The equations resulting from optimization will have a distribution of sizes up to the limits specified by the node collapsing properties. Some equations may be larger if they were already larger prior to optimization.

There will be a variety of choices left to the partitioning process about using inverters, exclusive-ORs, or implementing a register using an alternate flip-flop type, assuming the equation feeds a register. The partitioning process will select a representation of each equation to efficiently target each device.

3. Examples

The following examples illustrate various features of the invention in more detail than the examples given above.

A. Node Collapsing

The following example illustrates how node collapsing reduces the number of resources used in a design. Consider the following HDL representation of a logic system:

INPUT clk;

INPUT a, b, c, d;

OUTPUT x, y CLOCKED BY clk;

NODE n, m;

x=a*b*n;

y =/a*m+b*/m+y*a;

n=c*d;

m=c*d*x+c*/d*/x+/c*/d*x+/c*d*/x.

Figure 7A:
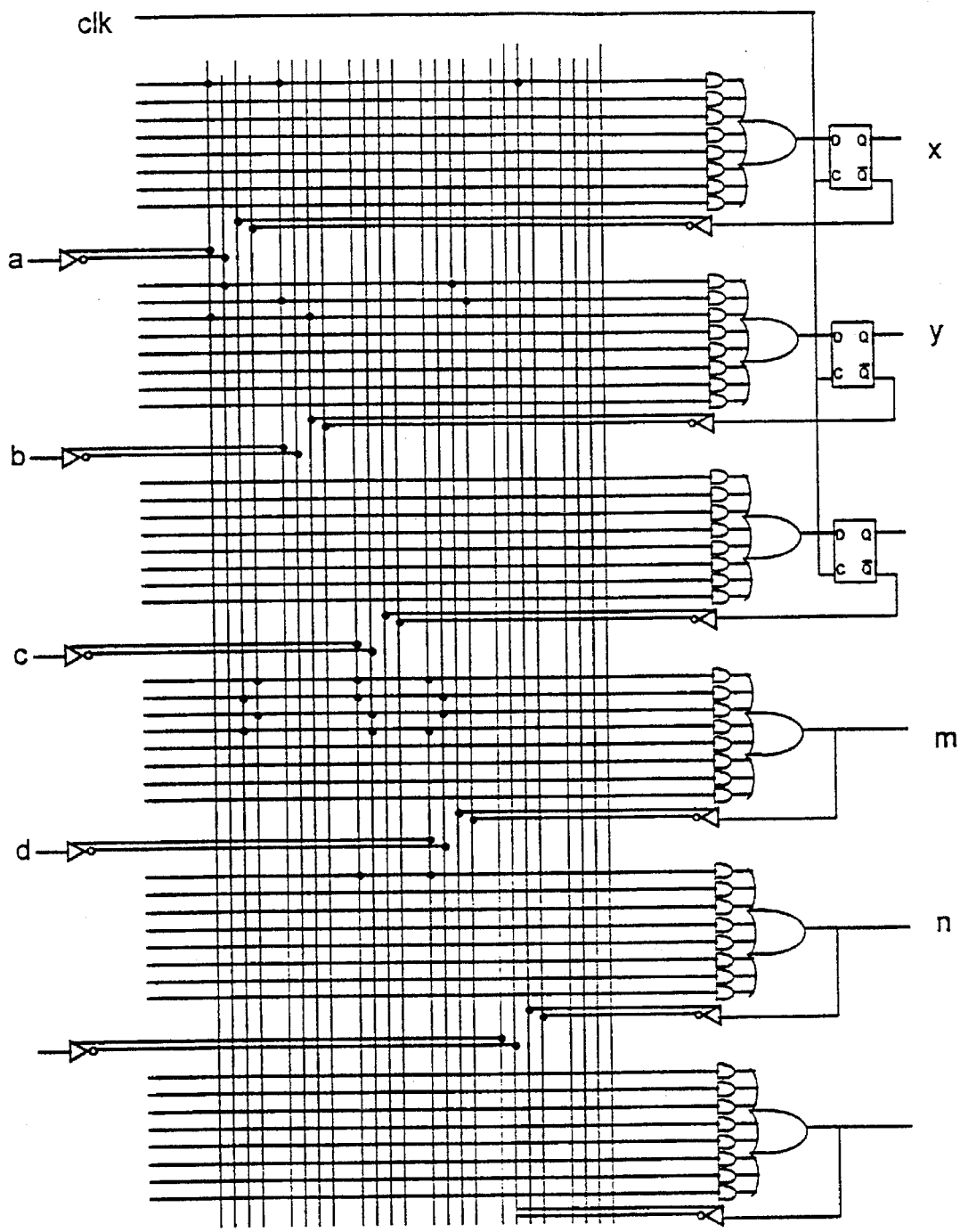
FIG. 7A shows a PLD optimized and programmed without node collapsing.

An implementation of these equations, without node collapsing, is shown in FIG. 7A. For ease of reference, the equations implemented in the figure are given at the bottom of the figure. In this implementation, four resources, x, y, n, and m, are used.

Collapsing the nodes using a MAX PTERMS of 8, which is appropriate for this device, causes the node "n" to be collapsed. The equations after collapsing are:

x=a*b*c*d;

y=/a*m+b*/m+y*a;

m=c*d*x+c*/d*/x+/c*/d*x+/c*d*/x.

Figure 7B:
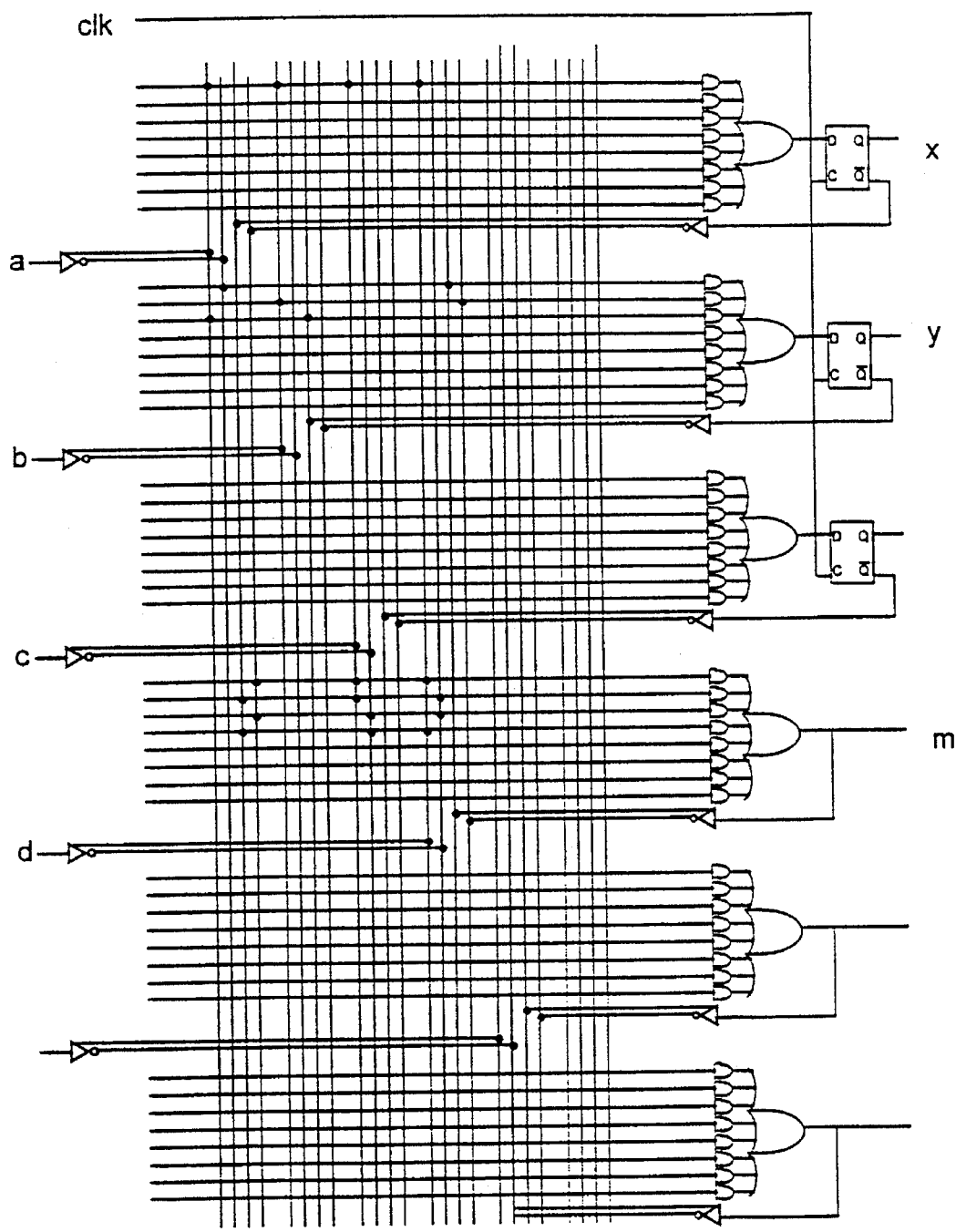
FIG. 7B shows a PLD having the same function as the PLD of FIG. 7A but which was optimized and programmed with node collapsing.

An implementation of these equations is shown in FIG. 7B. Note that three resources, x, y, m are used. Thus, one resource was saved in this example.

B. Arithmetic Node Insertion and Collapsing

The following example illustrates in detail the insertion of nodes in an arithmetic expression by the compiler and the subsequent collapsing of the equations. Consider the following HDL representation of a logic system, where the operator ".+." represents arithmetic addition and "a", "b", and "out" are eight-bit quantities:

INPUT a[8];

INPUT b[8];

OUTPUT out[8];

out=a.+.b.

Upon compilation and reduction with Espresso, we get the following representation for the system:

INPUT SIGNALS: a[7..0], b[7..0];
OUTPUT SIGNALS: out[7..0];
NODE SIGNALS: add_carry-1, add_carry-2, add_carry-3, add_carry-4, add_carry-5, add_carry-6, add_carry-7, add_carry-8;

Note that the compiler created the "add_carry" symbols.

REDUCED EQUATIONS: (Note: the symbol ~ indicates that an equation is the DeMorgan equivalent equation):

```
out[7].EQN    =    a[7]*b[7]*add_carry_7   +
    add_carry-7*/a[7]*/b[7] + b[7]*/a[7]*/add_carry-7
    + a[7]*/b[7]*/add_carry-7; (4 terms)
out[7].XORL = a[7]; (1 term)
out[7].XORR = add_carry-7*/b[7] + b[7]*/add_carry-7;
    (2 terms)
out[7].EQN(⁻)    =    b[7]*add_carry-7*/a[7]    +
    a[7]*add_carry-7*/b[7]+ a[7]*b[7]*/add_carry-7
    + /a[7]*/b[7]*/add_carry-7; (4 terms)
out[7].XORL(⁻) = /a[7]; (1 term)
out [ 7 ] . X O R R ( ⁻ )   =   b [ 7 ] * a d d _ c a r r y - 7   +
    /b[7]*/add_carry-7; (2 terms)
o u t [ 6 ] . E Q N   =   a [ 6 ] *b [ 6 ] * a d d _ c a r r y - 6   +
    add_carry-6*/a[6]*/b[6] + b[6]*/a[6]*/add_carry-6
    + a[6]*/b[6]*/add_carry-6; (4 terms)
out[6].XORL = a[6]; (1 term)
out[6].XORR = add_carry-6*/b[6] + b[6]*/add_carry-6;
    (2 terms)
out[6].EQN(⁻)    =    b[6]*add_carry-6*/a[6]    +
    a[6]*add_carry-6*/b[6] + a[6]*b[6]*/add_carry-6
    + /a[6]*/b[6]*/add_carry-6; (4 terms)
out[6].XORL(⁻) = /a[6]; (1 term)
o u t [ 6 ] . X O R R ( ⁻ )   =   b [ 6 ] * a d d _ c a r r y - 6   +
    /b[6]*/add_carry-6; (2 terms)
o u t [ 5 ] . E Q N   =   a [ 5 ] * b [ 5 ] * a d d _ c a r r y - 5   +
    add_carry-5*/a[5]*/b[5] + b[5]*/a[5]*/add_carry-5
    + a[5]*/b[5]*/add_carry-5; (4 terms)
out[5].XORL = a[5]; (1 term)
out[5].XORR = add_carry-5*/b[5] + b[5]*/add_carry-5;
    (2 terms)
out[5].EQN(⁻)    =    b[5]*add_carry-5*/a[5]    +
    a[5]*add_carry-5*/b[5] + a[5]*b[5]*/add_carry-5
    + /a[5]*/b[5]*/add_carry-5; (4 terms)
out[5].XORL(⁻) = /a[5]; (1 term)
o u t [ 5 ] . X O R R ( ⁻ )   =   b [ 5 ] * a d d _ c a r r y - 5   +
    /b[5]*/add_carry-5; (2 terms)
o u t [ 4 ] . E Q N   =   a [ 4 ] * b [ 4 ] * a d d _ c a r r y - 4   +
    add_carry-4*/a[4]*/b[4] + b[4]*/a[4]*/add_carry-4
    + a[4]*/b[4]*/add_carry-4; (4 terms)
out[4].XORL = a[4]; (1 term)
out[4].XORR = add_carry-4*/b[4] + b[4]*/add_carry-4;
    (2 terms)
out[4].EQN(⁻)    =    b[4]*add_carry-4*/a[4]    +
    a[4]*add_carry-4*/b[4] + a[4]*b[4]*/add_carry-4
    + /a[4]*/b[4]*/add_carry-4; (4 terms)
out[4].XORL(⁻) = /a[4]; (1 term)
o u t [ 4 ] . X O R R ( ⁻ )   =     b [ 4 ] * a d d _ c a r r y - 4   +
```

```
                    /b[4]*/add_carry-4; (2 terms)
out[3].EQN    =    a[3]*b[3]*add_carry-3   +
    add_carry-3*/a[3]*/b[3] + b[3]*/a[3]*/add_carry-3
    + a[3]*/b[3]*/add_carry-3; (4 terms)
out[3].XORL = a[3]; (1 term)
out[3].XORR = add_carry-3*/b[3] + b[3]*/add_carry-3;
    (2 terms)
out[3].EQN(⁻)   =   b[3]*add_carry-3*/a[3]   +
    a[3]*add_carry-3*/b[3] + a[3]*b[3]*/add_carry-3
    + /a[3]*/b[3]*/add_carry-3; (4 terms)
out[3].XORL(⁻) = /a[3]; (1 term)
out[3].XORR(⁻)   =   b[3]*add_carry-3   +
    /b[3]*/add_carry-3; (2 terms)
out[2].EQN    =    a[2]*b[2]*add_carry-2   +
    add_carry-2*/a[2]*/b[2] + b[2]*/a[2]*/add_carry-2
    + a[2]*/b[2]*/add_carry-2; (4 terms)
out[2].XORL = a[2]; (1 term)
out[2].XORR = add_carry-2*/b[2] + b[2]*/add_carry-2;
    (2 terms)
out[2].EQN(⁻)   =   b[2]*add_carry-2*/a[2]   +
    a[2]*add_carry-2*/b[2] + a[2]*b[2]*/add_carry-2
    + /a[2]*/b[2]*/add_carry-2; (4 terms)
out[2].XORL(⁻) = /a[2]; (1 term)
out[2].XORR(⁻)   =   b[2]*add_carry-2   +
    /b[2]*/add_carry-2; (2 terms)
out[1].EQN    =    a[1]*b[1]*add_carry-1   +
    add_carry-1*/a[1]*/b[1] + b[1]*/a[1]*/add_carry-1
    + a[1]*/b[1]*/add_carry-1; (4 terms)
out[1].XORL = a[1]; (1 term)
out[1].XORR = add_carry-1*/b[1] + b[1]*/add_carry-1;
    (2 terms)
out[1].EQN(⁻)   =   b[1]*add_carry-1*/a[1]   +
    a[1]*add_carry-1*/b[1] + a[1]*b[1]*/add_carry-1
    + /a[1]*/b[1]*/add_carry-1; (4 terms)
out[1].XORL(⁻) = /a[1]; (1 term)
out[1].XORR(⁻)   =   b[1]*add_carry-1   +
    /b[1]*/add_carry-1; (2 terms)
out[0].EQN = b[0]*/a[0] + a[0]*/b[0]; (2 terms)
out[0].XORL = a[0]; (1 term)
out[0].XORR = b[0]; (1 term)
out[0].EQN(⁻) = a[0]*b[0] + /a[0]*/b[0]; (2 terms)
out[0].XORL(⁻) = /a[0]; (1 term)
out[0].XORR(⁻) = /b[0]; (1 term)
add_carry-1.EQN = a[0]*b[0]; (1 term)
add_carry-1.EQN(⁻) = /a[0] + /b[0]; (2 terms)
add_carry-2.EQN = a[1]*b[1] + a[1]*add_carry-1   +
    b[1]*add_carry-1; (3 terms)
add_carry-2.EQN(⁻) = /a[1]*/b[1] + /a[1]*/add_carry-1
    + /b[1]*/add_carry-1; "(3 terms)
add_carry-3.EQN = a[2]*b[2] + a[2]*add_carry-2   +
    b[2]*add_carry-2 ; (3 terms)
add_carry-3.EQN(⁻) = /a[2]*/b[2] + /a[2]*/add_carry-2
    + /b[2]*/add_carry-2; (3 terms)
add_carry-4.EQN = a[3]*b[3] + a[3]*add_carry-3   +
    b[3]*add_carry-3; (3 terms)
add_carry-4.EQN(⁻) = /a[3]*/b[3] + /a[3]*/add_carry-3
    + /b[3]*/add_carry-3; (3 terms)
add_carry-5.EQN = a[4]*b[4] + a[4]*add_carry-4   +
    b[4]*add_carry-4; (3 terms)
add_carry-5.EQN(⁻) = /a[4]*/b[4] + /a[4]*/add_carry-4
    + /b[4]*/add_carry-4; (3 terms)
add_carry-6.EQN = a[5]*b[5] + a[5]*add_carry-5   +
    b[5]*add_carry-5; (3 terms)
add_carry-6. EQN(⁻) = /a[5]*/b[5] + /a[5]*/add_carry-5
    + /b[5]*/add_carry-5; (3 terms)
add_carry-7.EQN = a[6]*b[6] + a[6]*add_carry-6   +
    b[6]*add_carry-6; (3 terms)
add_carry-7.EQN(⁻) = /a[6]*/b[6] + /a[6]*/add_carry-6
    + /b[6]*/add_carry-6; (3 terms)
add_carry-8.EQN = a[7]*b[7] + a[7]*add_carry-7   +
    b[7]*add_carry-7; (3 terms)
add_carry-8.EQN(⁻) = /a[7]*/b[7] + /a[7]*/add_carry-7
    + /b[7]*/add_carry-7; (3 terms)
```

The equations above are similar to those that may be used in a ripple carry adder. The equations can perhaps best be examined by starting with "out[0].XORR(⁻)" and proceeding upward. It should be noted that the equations do not expand exponentially as in the prior art PLD tools, and, in fact, after the "out[1].EQN(⁻)" equation, they don't get more complicated. Thus, arithmetic expressions with almost any number of digits currently used in digital electronics can be handled by the optimizer according to the invention.

When the nodes are collapsed with the default limits of MAX SYMBOLS=20, MAX PTERM=16, MAX XOR PTERMS=0, POLARITY CONTROL=TRUE, and XOR POLARITY CONTROL=FALSE, and with Espresso reduction, the result is:

INPUT SIGNALS: a[7 . . . 0], b[7 . . . 0];

OUTPUT SIGNALS: out[7 . . . 0];

PHYSICAL NODE SIGNALS: add_carry-3, add_carry-5, add_carry-7;

Expressed as Boolean equations, the collapsed and reduced equations are:

```
out[7].EQN   =   a[7]*b[7]*add_carry-7   +
    add_carry-7*/a[7]*/b[7] + b[7]*/a[7]*/add_carry-7
    + a[7]*/b[7]*/add_carry-7; (4 terms)
out[7].XORL = a[7]; (1 term)
out[7].XORR = add_carry-7*/b[7] + b[7]*/add_carry-7;
(2 terms)
out[7].EQN(⁻)   =   b[7]*add_carry-7*/a[7]   +
    a[7]*add_carry-7*/b[7] + a[7]*b[7]*/add_carry-7
    + /a[7]*/b[7]*/add_carry-7; (4 terms)
out[7].XORL(⁻) = /a[7]; (1 term)
out[7].XORR(⁻)   =   b[7]*add_carry-7   +
    /b[7]*/add_carry-7; (2 terms)
out[6].EQN   =   a[6]*a[5]*b[6]*b[5]   +
    a[5]*b[5]*/a[6]*/b[6] + b[6]*/a[6]*/a[5]*/b[5] +
    a[6]*/a[5]*/b[6]*/b[5]   +
    a[6]*a[5]*b[6]*add_carry-5   +
    a[5]*add_carry-5*/a[6]*/b[6]   +
    a[6]*b[6]*b[5]*add_carry-5 +
    b[5]*add_carry-5*/a[6]/b[6]   +
    b[6]*/a[6]*/a[5]*/add_carry-5   +
    a[6]*/a[5]*/b[6]*/add_carry-5   +
    b[6]*/a[6]*/b[5]*/add_carry-5   +
    a[6]*/b[6]*/b[5]*/add_carry-5; (12 terms)
out[6].XORL = a[6]; (1 term)
out[6].XORR = a[5]*b[5]*/b[6] + b[6]*/a[5]*/b[5]   +
    a[5]*add_carry-5*/b[6] + b[5]*add_carry-5*/b[6]
    +   b[6]*/a[5]*/add_carry-5   +
    b[6]*/b[5]*/add_carry-5; (6 terms)
out[6].EQN(⁻)   =   a[5]*b[6]*b[5]*/a[6]   +
    a[6]*a[5]*b[5]*/b[6] + a[6]*b[6]*/a[5]*/b[5]   +
    /a[6]*/a[5]*/b[6]*/b[5]   +
    a[5]*b[6]*add_carry-5*/a[6]   +
    a[6]*b[5]*add_carry-5*/b[6]   +
    b[6]*b[5]*add_carry-5*/a[6]   +
    a[6]*b[5]*add_carry-5*/b[6]   +
    a[6]*b[6]*/a[5]*/add_carry-5   +
    /a[6]*/a[5]*/b[6]*/add_carry-5   +
    a[6]*b[6]*/b[5]*/add_carry-5   +
    /a[6]*/b[6]*/b[5]*/add_carry-5; (12 terms)
out[6].XORL(⁻) = /a[6]; (1 term)
out[6].XORR(⁻) = a[5]*b[6]*b[5] + /a[5]*/b[6]*/b[5] +
    a[5]*b[6]*add_carry-5 + b[6]*b[5]*add_carry-5 +
    /a[5]*/b[6]*/add_carry-5   +
    /b[6]*/b[5]*/add_carry-5; (6 terms)
out[5].EQN   =   a[5]*b[5]*add_carry-5   +
    add_carry-5*/a[5]*/b[5] + b[5]*/a[5]*/add_carry-5
    + a[5]*/b[5]*/add_carry-5; (4 terms)
out[5].XORL = a[5]; (1 term)
out[5].XORR = add_carry-5*/b[5] + b[5]*/add_carry-5;
(2 terms)
out[5].EQN(⁻)   =   b[5]*add_carry-5*/a[5]   +
    a[5]*add_carry-5*/b[5] + a[5]*b[5]*/add_carry-5
    + /a[5]*/b[5]*/add_carry-5; (4 terms)
out[5].XORL(⁻) = /a[5];"(1 term)
out[5].XORR(⁻)   =   b[5]*add_carry-5   +
    /b[5]*/add_carry-5; (2 terms)
out[4].EQN   =   a[4]*a[3]*b[4]*b[3]   +
    a[3]*b[3]*/a[4]*/b[4] + b[4]*/a[4]*/a[3]*/b[3] +
    a[4]*/a[3]*/b[4]*/b[3]   +
    a[4]*a[3]*b[4]*add_carry-3   +
    a[3]*add_carry-3*/a[4]*/b[4]   +
    a[4]*b[4]*b[3]*add_carry-3   +
    b[3]*add_carry-3*/a[4]*/b[4]   +
    b[4]*/a[4]*/a[3]*/add_carry-3   +
    a[4]*/a[3]*/b[4]*/add_carry-3   +
    b[4]*/a[4]*/b[3]*/add_carry-3   +
    a[4]*/b[4]*/b[3]*/add_carry-3; (12 terms)
out[4].XORL = a[4]; (1 term)
out[4].XORR = a[3]*b[3]*/b[4] + b[4]*/a[3]*/b[3] +
    a[3]*add_carry-3*/b[4] + b[3]*add_carry-3*/b[4]
    b[4]*/a[3]*/add_carry-3   +
    b[4]*/b[3]*/add_carry-3; (6 terms)
``` out[4].EQN(¯) =   a[3]*b[4]*b[3]*/a[4]   +
    a[4]*a[3]*b[3]*/b[4] + a[4]*b[4]*/a[3]*/b[3]   +
    /a[4]*/a[3]*/b[4]*/b[3]   +
    a[3]*b[4]*add_carry-3*/a[4]   +
    a[4]*a[3]*add_carry-3*/b[4]   +
    b[4]*b[3]*add_carry-3*/a[4]   +
    a[4]*b[3]*add_carry-3*/b[4]   +
    a[4]*b[4]*/a[3]*/add_carry-3   +
    /a[4]*/a[3]*/b[4]*/add_carry-3   +
    a[4]*b[4]*/b[3]*/add_carry-3   +
    a[4]*/b[4]*/b[3]*/add_carry-3; (12 terms)
out[4].XORL(¯) = /a[4]; (1 term)
out[4].XORR(¯) = a[3]*b[4]*b[3] + /a[3]*/b[4]*/b[3] +
    a[3]*b[4]*add_carry-3 + b[4]*b[3]*add_carry-3 +
    /a[3]*/b[4]*/add_carry_3   +
    /b[4]*/b[3]*/add_carry-3; (6 terms)
out[3].EQN   =   a[3]*b[3]*add_carry-3   +
    add_carry-3*/a[3]*/b[3] + b[3]*/a[3]*/add_carry-3
    + a[3]*/b[3]*/add_carry-3; (4 terms)
out[3].XORL = a[3]; (1 term)
out[3].XORR = add_carry-3*/b[3] + b[3]*/add_carry-3;
(2 terms)
out[3].EQN(¯)   =   b[3]*add_carry-3*/a[3]   +
    a[3]*add_carry-3*/b[3] + a[3]*b[3]*/add_carry-3
    + /a[3]*/b[3]*/add_carry-3; (4 terms)
out[3].XORL(¯) = /a[3]; (1 term)
out[3].XORR(¯)   =   b[3]*add_carry-3   +
    /b[3]*/add_carry-3; (2 terms)
out[2].EQN   =   b[2]*/a[2]*/a[1]*/b[1]   +
    a[2]*/a[1]*/b[2]*/b[1] + b[2]*/a[2]*/a[1]*/a[0]
    + a[2]*/a[1]*/a[0]*/b[2] + b[2]*/a[2]*/a[0]*/b[1]
    + a[2]*/a[0]*/b[2]*/b[1] + b[2]*/a[2]*/a[1]*/b[0]
    + a[2]*/a[1]*/b[2]*/b[0] + b[2]*/a[2]*/b[1]*/b[0]
    + a[2]*/b[2]*/b[1]*/b[0]+ a[2]*a[1]*b[2]*b[1] +
    a[1]*b[1]*/a[2]*/b[2] + a[2]*a[1]*a[0]*b[2]*b[0]
    +   a[1]*a[0]*b[0]*/a[2]*/b[2]   +
    a[2]*a[0]*b[2]*b[1]*b[0]   +
    a[0]*b[1]*b[0]*/a[2]*/b[2]; (16 terms)
out[2].XORL = a[2]; (1 term)
out[2].XORR = b[2]*/a[1]*/b[1] + b[2]*/a[1]*/a[0] +
    b[2]*/a[0]*/b[1]   +   b[2]*/a[1]*/b[0]   +
    b[2]*/b[1]*/b[0]   +   a[1]*b[1]*/b[2]   +
    a[1]*a[0]*b[0]*/b[2] + a[0]*b[1]*b[0]*/b[2]; (8
    terms)
out[2].EQN(¯)   =   a[2]*b[2]*/a[1]*/b[1]   +
    /a[2]*/a[1]*/b[2]*/b[1] + a[2]*b[2]*/a[1]*/a[0]
    + /a[2]*/a[1]*/a[0]*/b[2] + a[2]*b[2]*/a[0]*/b[1]
    + /a[2]*/a[0]*/b[2]*/b[1] + a[2]*b[2]*/a[1]*/b[0]
    + /a[2]*/a[1]*/b[2]*/b[0] + a[2]*b[2]*/b[1]*/b[0]
    + /a[2]*/b[2]*/b[1]*/b[0] + a[1]*b[2]*b[1]*/a[2]
    +   a[2]*a[1]*b[1]*/b[2]   +
    a[1]*a[0]*b[2]*b[0]*/a[2] +
a[2]*a[1]*a[0]*b[0]*/b[2]   +
    a[0]*b[2]*b[1]*b[0]*/a[2]   +
    a[2]*a[0]*b[1]*b[0]*/b[2]; (16 terms)
out[2].XORL(¯) = /a[2]; (1 term)
out[2].XORR(¯) = /a[1]*/b[2]*/b[1] + /a[1]*/a[0]*/b[2]
    + /a[0]*/b[2]*/b[1]   +   /a[1]*/b[2]*/b[0]   +
    /b[2]*/b[1]*/b[0] + a[1]*b[2]*b[1]   +
    a[1]*a[0]*b[2]*b[0] + a[0]*b[2]*b[1]*b[0]; (8
    terms)
out[1].EQN = b[1]*/a[1]*/a[0] + a[1]*/a[0]*/b[1]+
    b[1]*/a[1]*/b[0]   +   a[1]*/b[1]*/b[0]   +
    a[1]*a[0]*b[1]*b[0] + a[0]*b[0]*/a[1]*/b[1]; (6
    terms)
out[1].XORL = a[1]; (1 term)
out[1].XORR   =   b[1]*/a[0]   +   b[1]*/b[0]   +
    a[0]*b[0]*/b[1]; (3 terms)
out[1].EQN(¯) = a[1]*b[1]*/a[0] + /a[1]*/a[0]*/b[1]   +
    a[1]*b[1]*/b[0]   +   /a[1]*/b[1]*/b[0]   +
    a[0]*b[1]*b[0]*/a[1] +a[1]*a[0]*b[0]*/b[1]; (6 terms)
out[1].XORL(¯) = /a[1]; (1 term)
out[1].XORR(¯)   =   /a[0]*/b[1] + /b[1]*/b[0]   +
    a[0]*b[1]*b[0]; (3 terms)
out[0].EQN = b[0]*/a[0] + a[0]*/b[0]; (2 terms)
out[0].XORL = a[0]; (1 term)
out[0].XORR = b[0]; (1 term)
out[0].EQN(¯) = a[0]*b[0] + /a[0]*/b[0]; (2 terms)
out[0].XORL(¯) = /a[0]; (1 term)
out[0].XORR(¯) = /b[0]; (1 term)

-continued

```
add_carry-3.EQN = a[2]*b[2] + a[2]*a[1]*b[1] +
    a[1]*b[2]*b[1]    +    a[2]*a[1]*a[0]*b[0] +
    a[1]*a[0]*b[2]*b[0] + a[2]*a[0]*b[1]*b[0] +
    a[0]*b[2]*b[1]*b[0]; (7 terms)
add_carry-3.EQN(⁻) = /a[2]*/b[2] + /a[2]*/a[1]*/b[1]
    +    /a[1]*/b[2]*/b[1]    +    /a[2]*/a[1]*/a[0]    +
    /a[1]*/a[0]*/b[2]    +    /a[2]*/a[0]*/b[1]    +
    /a[0]*/b[2]*/b[1]    +    /a[2]*/a[1]*/b[0]    +
    /a[1]*/b[2]*/b[0]    +    /a[2]*/b[1]*/b[0]    +
    /b[2]*/b[1]*/b[0]; (11 terms)
add_carry-5.EQN    =    a[4]*b[4] + a[4]*a[3]*b[3]    +
    a[3]*b[4]*b[3]    +    a[4]*a[3]*add_carry-3    +
    a[3]*b[4]*add_carry-3 + a[4]*b[3]*add_carry-3 +
    b[4]*b[3]*add_carry-3; (7 terms)
add_carry-5.EQN(⁻) = /a[4]*/b[4] + /a[4]*/a[3]*/b[3]
    + /a[3]*/b[4]*/b[3] + /a[4]*/a[3]*/add_carry-3
    +    /a[3]*/b[4]*/add_carry-3    +
    /a[4]*/b[3]*/add_carry-3    +
    /b[4]*/b[3]*/add_carry-3; (7 terms)
add_carry-7.EQN    =    a[6]*b[6] + a[6]*a[5]*b[5]    +
    a[5]*b[6]*b[5]    +    a[6]*a[5]*add_carry-5    +
    a[5]*b[6]*add_carry-5 + a[6]*b[5]*add_carry-5 +
    b[6]*b[5]*add_carry-5; (7 terms)
add_carry-7.EQN(⁻) = /a[6]*/b[6] + /a[6]*/a[5]*/b[5]
    + /a[5]*/b[6]*/b[5] + /a[6]*/a[5]*/add_carry-5 +
    /a[5]*/b[6]*/add_carry-5    +
    /a[6]*/b[5]*/add_carry-5    +
    b[6]*/b[5]*/add_carry-5; (7 terms)
```

It should be noted that the nodes add_carry-1, add_carry-2, add_carry-4, and add_carry-6 were collapsed. The equations have gotten bigger, within the constraints of the ability to implement them, but the number of nodes, and thus resources used, has gone down.

C. Procedure Boundary Node Insertion and Collapsing

The following example illustrates the insertion of nodes at procedure boundaries by the compiler and the collapse of the compiled equations. Consider a procedure defined as:

PROCEDURE p1(INPUT a,b; OUTPUT x,y);

x=a*b;

y=x+a+b;

END p1.

A logic design using this procedure is:

INPUT in1, in2, in3;

NODE n1;

OUTPUT out1, out2, out3;

p1(in1, in2, n1, out1);

p1(n1, in3, out2, out3);

A compiled set of equations for the procedure with Espresso reduction is:

```
PROCEDURE p1
INPUT PARAMETERS a, b;
OUTPUT PARAMETERS x, y.
REDUCED EQUATIONS:
x.EQN = a*b; (1 term)
x.EQN(⁻) = /a + /b; (2 terms)
y.EQN = a + b + x; (3 terms)
y.EQN(⁻) = /a*/b*/x; (1 term)
```

These equations are held internally by the compiler for its own use.

The compiled equations for the above logic design with Espresso reduction are:

```
INPUT SIGNALS: in1, in2, in3;
OUTPUT SIGNALS: out1, out2, out3;
```

-continued

```
NODE SIGNALS: n1, p1.1.x, p1.1.y, p1.2.x, p1.2.y
REDUCED EQUATIONS:
n1.EQN = p1.1.x; (1 term)
n1.EQN(⁻) = /p1.1.x; (1 term)
out1.EQN = p1.1.y; (1 term)
out1.EQN(⁻) = /p1.1.y; (1 term)
out2.EQN = p1.2.x; (1 term)
out2.EQN(⁻) = /p1.2.x; (1 term)
out3.EQN = p1.2.y; (1 term)
out3.EQN(⁻) = /p1.2.y; (1 term)
p1.1.x.EQN = in1*in2; (1 term)
p1.1.x.EQN(⁻) = /in1 + /in2; (2 terms)
p1.1.y.EQN = in1 + in2 + p1.1.x; (3 terms)
p1.1.y.EQN(⁻) = /in1*/in2*/p1.1.x; (1 term)
p1.2.x.EQN = in3*n1; (1 term)
p1.2.x.EQN(⁻) = /in3 + /n1; (2 terms)
p1.2.y.EQN = in3 + n1 + p1.2.x; (3 terms)
p1.2.y.EQN(⁻) = /in3*/n1*/p1.2.x; (1 term)
```

If may be noted that some of the nodes were collapsed in the compiler. For example, the nodes that were generated to correspond to nodes a and b for both instantiations were collapsed.

The collapsed equations for the above logic design with the default limits and Espresso reduction are:

```
INPUT SIGNALS: in1, in2, in3;
OUTPUT SIGNALS: out1, out2, out3.
COLLAPSED AND REDUCED EQUATIONS:
out1.EQN = in1 + in2; (2 terms)
out1.EQN(⁻) = /in1*/in2; (1 term)
out2.EQN = in1*in2*in3; (1 term)
out2.EQN(⁻) = /in1 + /in2 + /in3; (3 terms)
out3.EQN = in3 + in1*in2; (2 terms)
out3.EQN(⁻) = /in1*/in3 + /in2*/in3; (2 terms)
```

In this case, not only were a large number of nodes collapsed, but the equations did not become any more complex. This is because the logic was such that it could be reduced significantly. Had the equations described in the PROCEDURE and the uses of the PROCEDURE been much more complex, then some of these nodes may have been retained.

D. Register Synthesis

The following example illustrates the synthesis of equations for implementing all four varieties of flip-flops when an equation feeds a register. Consider the following logic design:

INPUT a,b,c,d,clk;
OUTPUT out CLOCKED_BY clk;
out=(a*b)(+)(c+d);

A compiled set of equations for the logic design with Espresso reduction is:

```
INPUT SIGNALS: a, b, c, d, clk;
OUTPUT SIGNALS: out.
REDUCED EQUATIONS:
out.D = c*/a + c*/b + d*/a + d*/b + a*b*/c*/d; (5
    terms)
out.CLK = clk; (1 term)
out.XORL = a*b; (1 term)
out.XORR = c + d; (2 terms)
out.D(~) = a*b*c + a*b*d + /a*/c*/d + /b*/c*/d; (4
    terms)
out.CLK(~) = /clk; (1 term)
out.XORL(~) = /a + /b; (2 terms)
out.XORR(~) = /c*/d; (1 term)
```

The collapsed synthesized equations for the above logic design with the default limits and Espresso reduction are:

```
INPUT SIGNALS: a, b, c, d, clk;
OUTPUT SIGNALS: out.
COLLAPSED AND REDUCED EQUATIONS:
out.D = c*/a + c*/b + d*/a + d*/b + a*b*/c*/d; (5
    terms)
out.T = c*/a*/out + c*/b*/out + d*/a*/out + d*/b*/out
    + a*b*c*out + a*b*d*out + out*/a*/c*/d +
    out*/b*/c*/d + a*b*/c*/d*/out; (9 terms)
out. S = c*/a + c*/b + d*/a + d*/b + a*b*/c*/d; (5
    terms)
out.R = a*b*c + a*b*d + /a*/c*/d + /b*/c*/d; (4 terms)
out.J = c*/a + c*/b + d*/a + d*/b + a*b*/c*/d; (5
    terms)
out.K = a*b*c + a*b*d + /a*/c*/d + /b*/c*/d; (4 terms)
out.CLK = clk; (1 term)
out.XORL = a*b; (1 term)
out.XORR = c + d; (2 terms)
out.D(~) = a*b*c+ a*b*d + /a*/c*/d + /b*/c*/d; (4
    terms)
out.T(~) = c*out*/a + c*out*/b + d*out*/a+ d*out*/b +
    a*b*c*/out + a*b*d*/out + /a*/c*/d*/out +
    /b*/c*/d*/out + a*b*out*/c*/d; (9 terms)
out.S(~) = a*b*c + a*b*d + /a*/c*/d + /b*/c*/d; (4
    terms)
out.R(~) = c*/a + c*/b + d*/a + d*/b + a*b*/c*/d; (5
    terms)
out.J(~) = a*b*c + a*b*d + /a*/c*/d + /b*/c*/d; (4
    terms)
out.K(~) = c*/a + c*/b + d*/a + d*/b + a*b*/c*/d; (5
    terms)
out.CLK(~) = /clk; (1 term)
out.XORL(~) = /a + /b; (2 terms)
out.XORR(~) = /c*/d; (1 term)
```

Here the number of equations became significantly larger, because they now include an implementation for every type of flip-flop. However, a wider choice of implementations is possible, and when one is selected, it will likely involve less logic and less resources than the one choice there was before register synthesis.

E. Alternative Implementations

The following example shows how the optimizer can provide a choice between a wide variety of implementations for a single design. The logic design:

INPUT a, b, c, clk;
OUTPUT x CLOCKED BY clk;
has the following two level sum-of-products representation:

$$x=(a*b)(+)(c+x).$$

The collapsed, synthesized, and reduced equations are:

x.d=c*/a+c/b+x*/a+x*/b+a*b*/c*/x;
x.d(~)=a*b*c+a*b*x+/a,/c*/x+/b*/c*/x;
x.t=c*/a*/x+c*/b*/x+a*b*x+a*b*/c;
x.xorl=a*b;
x.xorr=c+x.

Figure 8A:
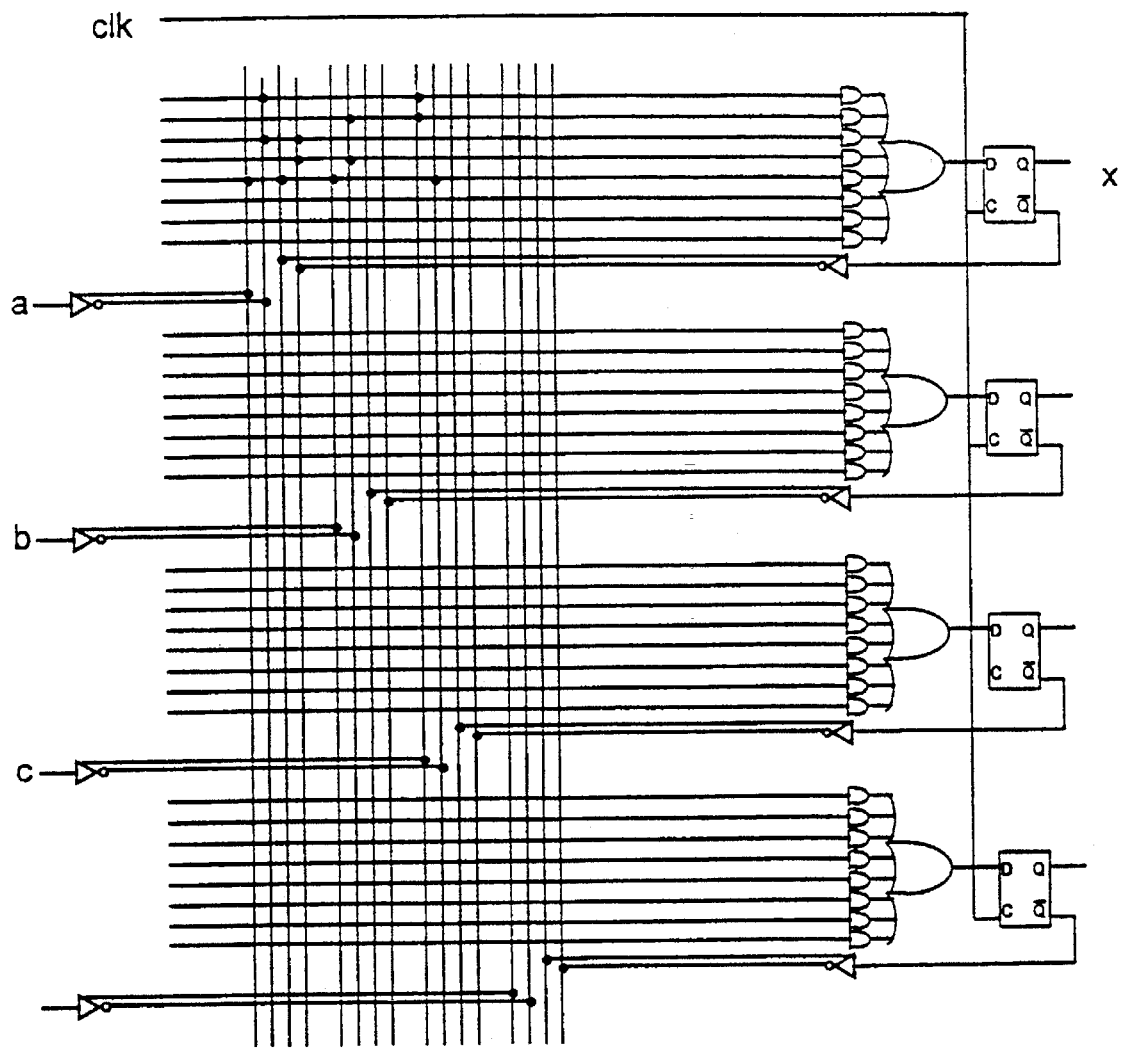
FIGS. 8A through 8D illustrate a variety of implementations of a single registered output as determined by the optimizer and register synthesis programs according to the invention.
Figure 8B:
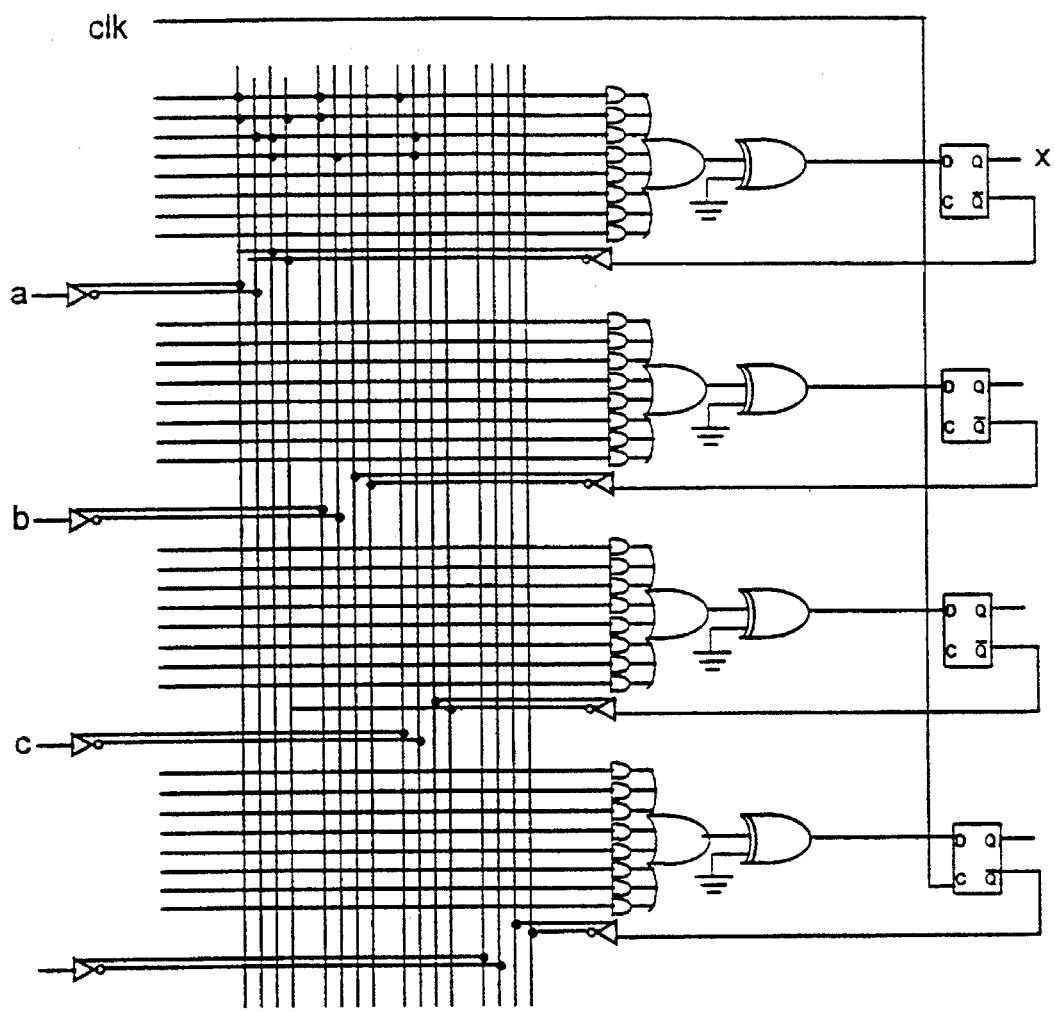
Figure 8C:
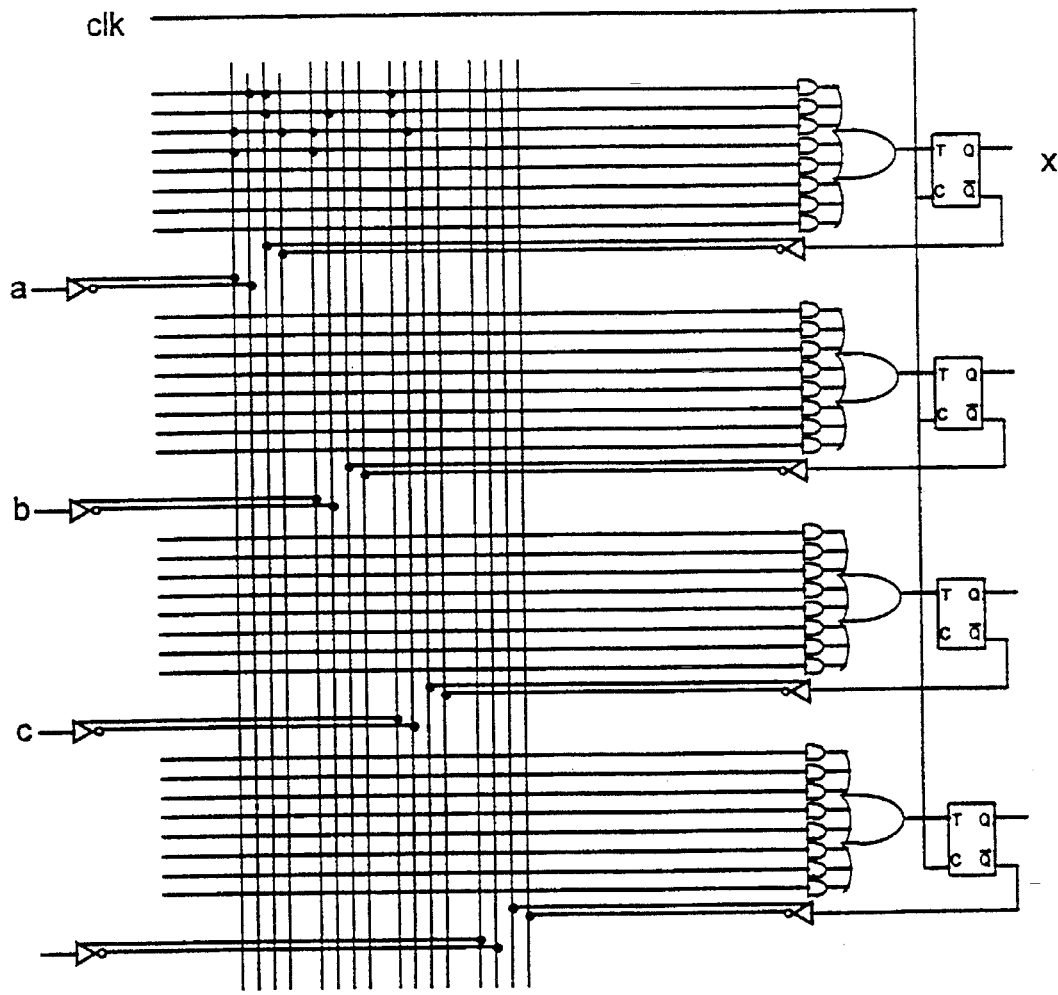
Figure 8D:
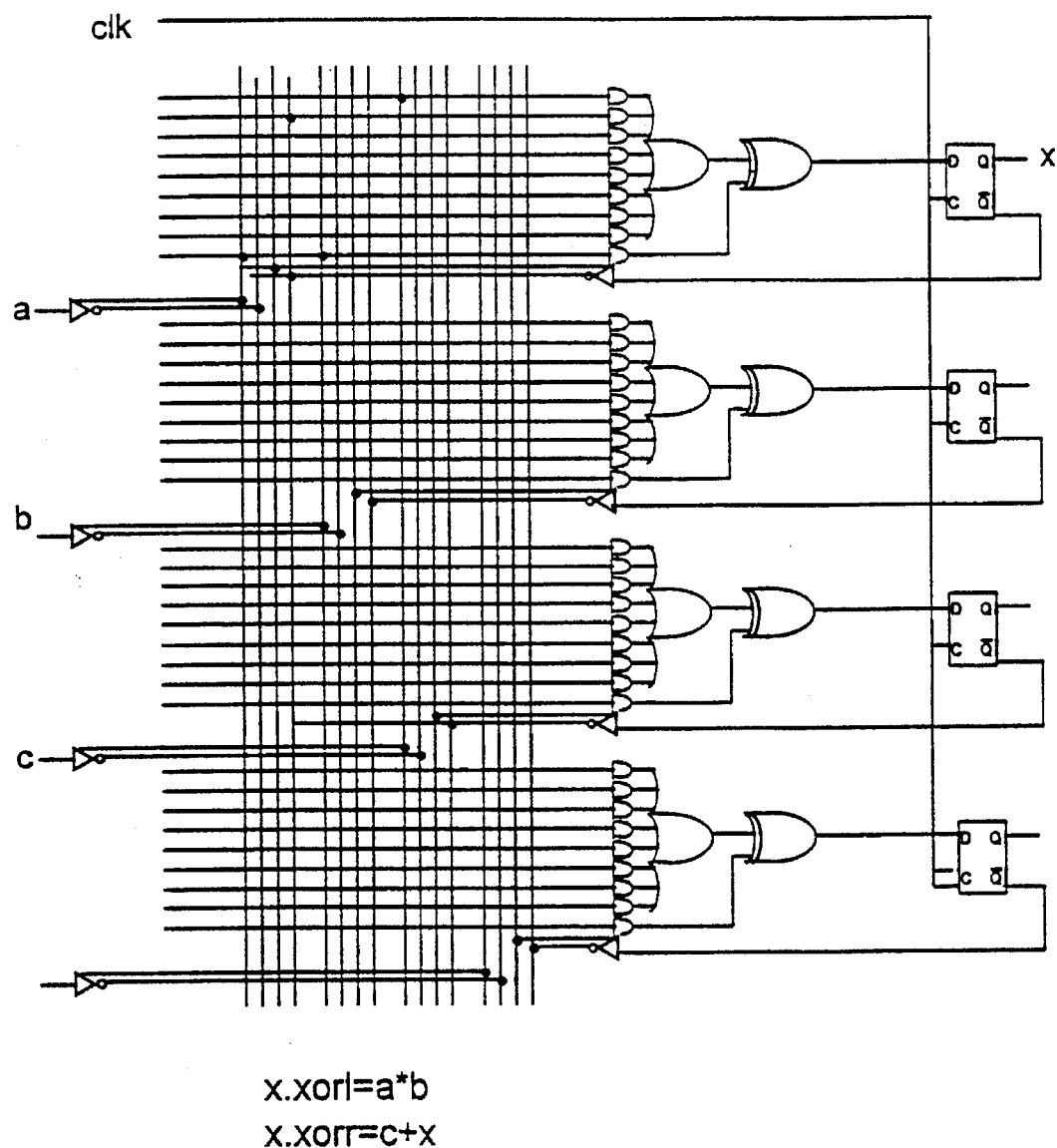

The implementations of these equations is shown in FIGS. 8A through 8D. FIG. 8A is an example of fitting the .d equation into a device that has ordinary D flip-flops without a fusible inverter. FIG. 8B is an example of fitting the complement .d equation into a device that has D flip-flops with a fusible inverter. FIG. 8C is an example of fitting the .t equation into a device that has T flip-flops. And FIG. 8D is an example of fitting the .xorl and .xorr equations into a device that has D flip-flops fed by an exclusive-OR gate. Thus, the optimizer system according to the invention has presented options for implementation of the device in target PLDs that include either fusible inverters, exclusive-OR gates, D flip-flops, or T flip-flops. Other options could have also been provided.

There has been described a novel PLD optimizer system which provides optimal use of PLD resources, permits optimal selection of PLDs and programming thereof, and has many other advantages. It should be understood that the particular embodiment shown in the drawings and described within this specification is for purposes of example and should not be construed to limit the invention which will be described in the claims below. Further, it is evident that those skilled in the art may now make numerous uses and modifications of the specific embodiment described, without departing from the inventive concepts. For example, now that it is seen to be advantageous to insert nodes and then to collapse them using a particular insertion architecture and a particular collapsing constraint architecture, other architectures for either insertion, collapsing, or both may be used. Further, the invention clearly shows the advantages of register synthesis and maintaining DONT CARE information. Thus, these inventive elements of node insertion, node collapsing, register synthesis, and maintaining of DONT CARE information may be applied to circuits similar to PLDs, such as programmable gate arrays (PGAs). Or equivalent circuits, circuit components, or software programs can be substituted for the various circuits, circuit components, and software programs described. Additional features may be added. A greater or lesser number of parts may be used. Consequently, the invention is to be construed as embracing each and every novel feature and novel combination of features present in and/or possessed by the optimizer system described.

What is claimed is:

1. A system for designing logic circuits to be implemented in one or more programmable logic devices, said system comprising:

a data storage device, said data storage device having stored therein information representing details of a plurality of programmable logic devices, each of said devices having a limited number of resources and a limited number of logic components per resource, wherein the limited number of resources comprise outputs of the programmable logic device together with internal nodes of the programmable logic device that feed back into the programmable logic device;

data input means for inputting information related to a logic circuit into said data storage device; and computer means for designing said logic circuit using some of said limited number of resources and said limited number of logic components, said logic circuit designed for implementation in said one or more programmable logic devices, said computer means comprising resource minimizing means for minimizing the number of said limited number of resources that are used without exceeding said limited number of logic components per resource.

2. A system as in claim 1 wherein said logic components comprise at least one OR gate having a predetermined number of inputs, and said minimization means comprises means for minimizing the number of said limited number of resources that are used without exceeding the number of said logic inputs.

3. A system as in claim 2 wherein said logic components further comprise a fusible inverter, and said minimization means is responsive to the presence of said fusible inverter.

4. A system as in claim 2 wherein said logic components further comprise an XOR gate, and said minimization means is responsive to the presence of said XOR gate.

5. A system as in claim 2 wherein said logic components further comprise a fusible XOR gate, and said minimization means is responsive to the presence of said fusible XOR gate.

6. A system as in claim 1 wherein said input information includes register information related to a register of a first type, and said computer means further comprises:

register synthesis means for generating a first register design using at least a first type of register and a second register design using at least a second type of register, and register selection means for permitting the selection of the optimum one of said first and second register designs.

7. A system as in claim 6 wherein said register synthesis means comprises means for generating said first register design utilizing a D-type flip-flop, said second register design utilizing a JK-type flip-flop, a third logic circuit design utilizing an SR-type flip-flop, and a fourth logic circuit design utilizing a T-type flip-flop when said input information specifies any flip-flop from the group comprising a D-type flip-flop, a JK-type flip-flop, an SR-type flip-flop, and a T-type flip-flop.

8. A system as in claim 1 further including final reducing means for reducing the logic in said logic circuit after the circuit has been designed, wherein said input information includes DONT CARE information, and said computer means comprises DONT CARE information retaining means for retaining all of said DONT CARE information until said final reducing means reduces said logic circuit.

9. A system as in claim 8 wherein said logic circuit includes a circuit output and said DONT CARE information retaining means comprises means for generating a first circuit design related to the ON state of said output and for generating a second circuit design related to the OFF state of said output, and said DONT CARE information is whatever state or states are not included in said first and second designs.

10. A computerized electronic design system comprising:

a data storage device, said data storage device having stored therein details of a plurality of programmable electronic devices, each of said devices having one or more registers;

data input means for inputting data related to a logic circuit into said data storage device; and computer means for designing said logic circuits for implementation in said one or more programmable electronic devices, said computer means comprising:

register synthesis means for generating a first register design using at least a first type of register and a second register design using at least a second type of register; and register selection means for selecting one of said first and second register designs.

11. A computerized logic system as in claim 10 wherein said computer means further comprises partitioning means for partitioning said logic circuit into a plurality of PLDs, said partitioning means choosing between said first and second register designs to perform said partitioning.

12. A computerized electronic design system as in claim 10 wherein said register synthesis means comprises means for generating said first register design utilizing a D-type flip-flop, said second register design utilizing a JK-type flip-flop, a third logic circuit design utilizing an SR-type flip-flop, and a fourth logic circuit design utilizing a T-type flip-flop when said input information specifies any flip-flop from the group comprising a D-type flip-flop, a JK-type flip-flop, an SR-type flip-flop, and a T-type flip-flop.

13. A computerized electronic design system comprising:

a data storage device, said data storage device having stored therein details of a plurality of programmable electronic devices;

data input means for inputting data related to a logic circuit into said data storage device, said logic circuit having at least one node; and computer means for designing one or more representations of logic circuits for implementation in one or more of said programmable electronic devices, wherein a first circuit representation relates to the ON state of said node and a second circuit representation relates to the OFF state of said node, said computer means comprising:

means for determining DONT CARE information from said first circuit representation and said second circuit representation;

final reducing means for reducing said circuit representations after they have been designed; and DONT CARE information retaining means for retaining all of said DONT CARE information until said final reducing means reduces said one or more circuit representations; and implementing means for selecting one or more of said circuit representations and implementing it into a programmable electronic device.

14. A computerized electronic design system as in claim 13 wherein said DONT CARE information retaining means comprises:

means for retaining said ON state data and said OFF state data.

15. A computerized electronic design system as in claim 14 wherein said DONT CARE information retaining means comprises means for preserving said ON and OFF state information until said final reduction process.

16. A computerized design system for designing a logic circuit to be implemented in a programmable logic device having a limited logic capability, said system comprising:

a data storage device;

data input means for inputting a hardware description of said logic circuit into said data storage device;

a compiler communicating with said data storage device for determining a plurality of physical nodes from said hardware description and for inserting a plurality of virtual nodes into said hardware description, said compiler also generating one or more equations representative of said logic circuit from said hardware description, said equations including one or more nodal equations representative of said virtual and physical nodes of said logic circuit;

node minimizing means for minimizing the number of said nodal equations without exceeding the logic capabilities of said programmable logic device; and implementing means for translating said equations into one or more implementations of said logic circuit in said programmable logic device.

17. A computerized design system for designing a logic circuit to be implemented in one or more programmable logic devices, said system comprising:

a data storage device;

data input means for inputting data to be used in the design of said logic circuit into said data storage device, said data including a maximum symbols parameter;

compiler means communicating with said data storage device for generating one or more equations representative of said logic circuit, said equations including one or more nodal equations representing nodes of said logic circuit, wherein said equations comprise logical combinations of symbols, each symbol representing one or more components of said programmable logic devices selected from the group comprising: inputs to said programmable logic devices, outputs to said programmable logic devices, and nodes of said programmable logic devices;

node minimizing means for minimizing the number of said nodal equations without causing the number of unique symbols in any one of said equations to exceed said maximum symbols parameter; and implementing means for translating said minimized number of nodal equations into one or more implementations of said logic circuit in said one or more programmable logic devices.

18. A computerized design system as in claim 17 wherein said nodal equations are sum-of-products equations comprising a number of product terms, said input data further includes a maximum product terms parameter, and said node minimizing means further comprises means for minimizing the number of said nodal equations without causing the number of product terms in any of said equations to exceed said maximum product terms parameter.

19. A computerized design system as in claim 18 wherein said minimizing means comprises first collapsing means for tentatively collapsing a selected nodal equation into the other equations, checking to see if any of the other equations expand beyond said maximum symbols and maximum product term parameters, and second collapsing means for collapsing said selected node only if the none of the tentatively collapsed equations exceed said maximum symbols and maximum product term parameters.

20. A computerized design system as in claim 17 wherein said equations are sum-of-products equations comprising a number of product terms, said compiler means comprises means for generating both the ON representation and the OFF representation for each of said nodal equations, said input data further includes a maximum product terms parameter and a binary polarity control parameter, and said node minimizing means comprises collapsing means for collapsing a selected nodal equation into the other nodal equations if said polarity control parameter is true and either the number of ON product terms or the number of OFF product terms is less than or equal to said maximum product terms parameter.

21. A computerized design system as in claim 17 wherein said equations are sum-of-products equations comprising a number of product terms, said input data further includes a maximum product terms parameter and a binary polarity control parameter, said compiler means comprises means for generating both an ON representation comprising a number of ON product terms and an OFF representation comprising a number of OFF product terms for each of said nodal equations, and said node minimizing means comprises collapsing means for collapsing a selected nodal equation into the other nodal equations if said polarity control parameter is false and both the number of ON product terms and the number of OFF product terms are less than or equal to said maximum product terms parameter.

22. A computerized design system as in claim 17 wherein said equations include an exclusive-OR (XOR) of a LEFT side sum-of-products equation and a RIGHT side sum-of-products equation, said input data further includes a binary XOR polarity control parameter and a maximum XOR product terms parameter, said compiler means comprises means for generating both ON representations comprising a number of XOR RIGHT ON product terms and a number of XOR LEFT ON product terms and OFF representations comprising a number of XOR RIGHT OFF product terms and a number of XOR LEFT OFF product terms for each of said sum-of-products equations, and said node minimizing means comprises collapsing means for collapsing a selected sum-of-products equation into the other nodal equations if both the number of XOR LEFT ON product terms and the number of XOR LEFT OFF product terms is equal to 1 and said XOR polarity control parameter is true and either the number of XOR RIGHT ON product terms or the number of XOR RIGHT OFF product terms is less than or equal to said maximum XOR product terms parameter.

23. A computerized design system as in claim 17 wherein said equations include an exclusive-OR (XOR) of a LEFT side sum-of-products equation and a RIGHT side sum-of-products equation, said input data further includes an XOR polarity control parameter and a maximum XOR product terms parameter, said compiler means comprises means for generating both ON representations comprising a number of XOR RIGHT ON product terms and a number of XOR LEFT ON product terms and OFF representations comprising a number of XOR RIGHT OFF product terms and XOR LEFT OFF product terms for each of said sum-of-products equations, and said node minimizing means comprises collapsing means for collapsing a selected nodal equation into the other nodal equations if either the number of XOR LEFT ON product terms or the number of XOR LEFT OFF product terms is equal to 1 and said XOR polarity control parameter is false and both the number of XOR RIGHT ON product terms and the number of XOR RIGHT OFF product terms are less than or equal to said maximum XOR product terms parameter.

24. A computerized design system as in claim 17 wherein said equations include an exclusive-OR (XOR) of a LEFT side sum-of-products equation and a RIGHT side sum-of-products equation, said input data further includes binary XOR polarity control parameter and a maximum XOR product terms parameter, said compiler means comprises means for generating both ON representations comprising a number of XOR RIGHT ON product terms and a number of XOR LEFT ON product terms and OFF representations comprising a number of XOR RIGHT OFF product terms and XOR LEFT OFF product terms for each of said sum-of-products equations, and said node minimizing means comprises collapsing means for collapsing a selected nodal equation into the other nodal equations if both the number of XOR RIGHT ON product terms and the number of XOR RIGHT OFF product terms are equal to 1 and either the number of XOR LEFT ON product terms or the number of XOR LEFT OFF product terms is less than or equal to said maximum XOR product terms parameter.

25. A computerized design system as in claim 17 wherein said equations include an exclusive-OR (XOR) of a LEFT side sum-of-products equation and a RIGHT side sum-of-products equation, said input data further includes a binary XOR polarity control parameter and a maximum XOR product terms parameter, said compiler means comprises means for generating both ON representations comprising a number of XOR RIGHT ON product terms and a number of XOR LEFT ON product terms and OFF representations comprising a number of XOR RIGHT OFF product terms and a number of XOR LEFT OFF product terms for each of said sum-of-products equations, and said node minimizing means comprises collapsing means for collapsing a selected sum-of-products equation into the other nodal equations if either the number of XOR RIGHT ON product terms or the number of XOR RIGHT OFF product terms is equal to 1 and said XOR polarity control parameter is true and either the number of XOR LEFT ON product terms or the number of XOR LEFT OFF product terms is less than or equal to said maximum XOR product terms parameter.

26. A computerized design system as in claim 17 wherein said equations include an exclusive-OR (XOR) of a LEFT side sum-of-products equation and a RIGHT side sum-of-products equation, said input data further includes a binary XOR polarity control parameter and a maximum XOR product terms parameter, said compiler means comprises means for generating both ON representations comprising a number of XOR RIGHT ON product terms and a number of XOR LEFT ON product terms and OFF representations comprising a number of XOR RIGHT OFF product terms and a number of XOR LEFT OFF product terms for each of said sum-of-products equations, and said node minimizing means comprises collapsing means for collapsing a selected sum-of-products equation into the other nodal equations if either the number of XOR RIGHT ON product terms or the number of XOR RIGHT OFF product terms is equal to 1 and said XOR polarity control parameter is false and both the number of XOR LEFT ON product terms and the number of XOR LEFT OFF product terms are less than or equal to said maximum XOR product terms parameter.

27. A computerized design system as in claim 17 wherein said compiler further comprises node insertion means for inserting nodes into said equations.

28. A computerized design system as in claim 27 wherein said node insertion means comprises means for inserting nodes at the carry-bits of arithmetic and relational operators.

29. A computerized design system as in claim 27 wherein said node insertion means comprises means for inserting nodes at function and procedure boundaries.

30. A computerized design system as in claim 27 wherein said node insertion means comprises means for inserting nodes to break up complex constructs.

31. A computerized design system as in claim 17 wherein said compiler means comprises means for generating both the ON representation and the OFF representation for each of said nodal equations.

32. A computerized design system as in claim 31 wherein said minimizing means comprises means for retaining both ON and OFF equations throughout the minimization process.

33. A computerized design system as in claim 17 wherein said logic circuit includes a register of a first type, said equations include an equation feeding an input of said register, and said system further comprises register synthesis means for generating an equation for each of a plurality of types of registers from said equation feeding said register of a first-type.

34. A computerized design system as in claim 33 wherein said register synthesis means comprises equation translating means for translating each equation that feeds a first variety of flip-flop into the corresponding equations for other varieties of flip-flops.

35. A computerized design system as in claim 34 wherein said equation translating means comprises mapping means for mapping each said equation that feeds a flip-flop to an equation that feeds a D-type flip-flop if the equation is not already an equation that feeds a D-type flip-flop, then mapping each such equation that feeds a D-type flip-flop to equations that feed every other type of flip-flop.

36. A computerized design system for designing a logic circuit to be implemented in one or more programmable electronic devices, said system comprising:

a data storage device;

data input means for inputting data to be used in the design of said logic circuit into said data storage device;

compiler means communicating with said data storage device for defining a plurality of nodes within said logic circuit and generating one or more equations representative of said logic circuit, said equations including both an ON representation and an OFF representation for each of said nodes;

equation minimizing means for minimizing the number of said equations while retaining both the ON and OFF representations for each equation throughout the minimization process thereby retaining all DONT CARE information for said logic circuit; and implementing means for translating said equations into one or more implementations of said logic circuit in said one or more programmable electronic devices.

37. A computerized design system for designing a logic circuit to be implemented in one or more programmable logic devices; said system comprising:

a data storage device;

data input means for inputting data to be used in the design of said logic circuit into said data storage device, said data including a maximum product terms parameter;

compiler means communicating with said data storage means for determining a plurality of nodes in said logic circuit and for generating one or more sum-of-products equations each having a number of product terms representative of said logic circuit said sum-of-products equations including a number of nodal equations representing nodes of said logic circuit in terms of symbols, said symbols representing one or more components of said programmable logic devices selected from the group comprising: inputs to said programmable logic devices, outputs to said programmable logic devices, and nodes of said programmable logic devices;

node minimizing means for minimizing the number of nodal equations without causing the number of product terms in any one of said equations to exceed said maximum product terms parameter; and implementing means for translating said equations into one or more implementations of said logic circuit in said one or more programmable logic devices.

38. A computerized design system for designing a logic circuit to be implemented in one or more programmable logic devices; said system comprising:

a data storage device;

data input means for inputting data to be used in the design of said logic circuit into said data storage device, said data including a maximum product terms parameter and a binary polarity control parameter;

compiler means communicating with said data storage device for generating one or more sum-of-products equations, representative of said logic circuit, said sum-of-products equations including both an ON representation including a number of ON-product terms and an OFF representation including a number of OFF-product terms for one or more nodal equations representing nodes of said logic circuit in terms of symbols, said symbols representing one or more components of said programmable logic devices selected from the group comprising: inputs to said programmable logic devices, outputs to said programmable logic devices, and nodes of said programmable logic devices;

node minimizing means for minimizing the number of said nodal equations, said node minimizing means comprising node collapsing means for collapsing a selected nodal equation into the other nodal equations if said polarity control parameter is true and either the number of ON product terms or the number of OFF product terms is less than or equal to said maximum product terms parameter; and implementing means for translating said equations into one or more implementations of said logic circuit in said one or more programmable logic devices.

39. A computerized design system as in claim 38 wherein said collapsing means further comprises means for collapsing said selected nodal equation into said other nodal equations if said polarity control parameter is false and both the number of ON product terms and the number of OFF product terms are less than or equal to said maximum product terms parameter.

40. A computerized design system as in claim 38 wherein said input data further includes an XOR polarity control parameter and a maximum XOR product terms parameter, said equations include an exclusive-OR of a left sum-of-products equation having a number of XOR LEFT ON and a number of XOR LEFT OFF product terms and a right sum of products equation having a number of XOR RIGHT ON and a number of XOR RIGHT OFF product terms, and said node collapsing means further comprises means for collapsing said selected nodal equation into said other nodal equations if both the number of XOR LEFT ON product terms and the number of XOR LEFT OFF product terms is equal to 1 and said XOR polarity control parameter is true and either the number of XOR RIGHT ON product terms or the number of XOR RIGHT OFF product terms is less than or equal to said maximum XOR product terms parameter.

41. A computerized design system as in claim 38 wherein said input data further includes an XOR polarity control parameter and a maximum XOR product terms parameter, said equations include an exclusive-OR of a left sum-of-products equation having a number of XOR LEFT ON and a number of XOR LEFT OFF product terms and a right sum of products equation having a number of XOR RIGHT ON and a number of XOR RIGHT OFF product terms, and said node collapsing means further comprises means for collapsing said selected nodal equation into said other nodal equations if either the number of XOR LEFT ON product terms or the number of XOR LEFT OFF product terms is equal to 1 and said XOR polarity control parameter is false and both the number of XOR RIGHT ON product terms and the number of XOR RIGHT OFF product terms are less than or equal to said maximum XOR product terms parameter.

42. A computerized design system as in claim 38 wherein said input data further includes an XOR polarity control parameter and a maximum XOR product terms parameter, said equations include an exclusive-OR of a left sum-of-products equation having a number of XOR LEFT ON and a number of XOR LEFT OFF product terms and a right sum of products equation having a number of XOR RIGHT ON and a number of XOR RIGHT OFF product terms, and said node collapsing means further comprises means for collapsing said selected nodal equation into said other nodal equations if both the number of XOR RIGHT ON product terms and the number of XOR RIGHT OFF product terms are equal to 1 and either the number of XOR LEFT ON product terms or the number of XOR LEFT OFF product terms is less than or equal to said maximum XOR product terms parameter.

43. A computerized design system as in claim 38 wherein said input data further includes an XOR polarity control parameter and a maximum XOR product terms parameter, said equations include an exclusive-OR of a left sum-of-products equation having a number of XOR LEFT ON and a number of XOR LEFT OFF product terms and a right sum of products equation having a number of XOR RIGHT ON and a number of XOR RIGHT OFF product terms, and said node collapsing means further comprises means for collapsing said selected nodal equation into said other nodal equations if either the number of XOR RIGHT ON product terms or the number of XOR RIGHT OFF product terms is equal to 1 and said XOR polarity control parameter is true and either the number of XOR LEFT ON product terms or the number of XOR LEFT OFF product terms is less than or equal to said maximum XOR product terms parameter.

44. A computerized design system as in claim 38 wherein said input data further includes an XOR polarity control parameter and a maximum XOR product terms parameter, said equations include an exclusive-OR of a left sum-of-products equation having a number of XOR LEFT ON and a number of XOR LEFT OFF product terms and a right sum of products equation having a number of XOR RIGHT ON and a number of XOR RIGHT OFF product terms, and said node collapsing means further comprises means for collapsing said selected nodal equation into said other nodal equations if either the number of XOR RIGHT ON product terms or the number of XOR RIGHT OFF product terms is equal to 1 and said XOR polarity control parameter is false and both the number of XOR LEFT ON product terms and the number of XOR LEFT OFF product terms are less than or equal to said maximum XOR product terms parameter.

45. A method of designing a logic circuit to be implemented in one or more programmable logic devices, said method comprising the steps of:

inputting data in a first hardware description format to be used in the design of said logic circuit into a data storage device, said data including a maximum symbols parameter;

compiling said input data to generate a number of nodal equations representative of nodes of said logic circuit in terms of symbols, said symbols representing one or more components of said programmable logic devices selected from the group comprising: inputs to said programmable logic devices, outputs to said programmable logic devices, and nodes of said programmable logic devices;

minimizing the number of said nodal equations without causing the number of unique symbols in any one of said equations to exceed said maximum signals parameter; and translating said equations into one or more implementations of said logic circuit in said one or more programmable logic devices.

46. A method of designing a logic circuit to be implemented in a programmable logic device having a limited logic capability, said method comprising:

inputting data to be used in the design of said logic circuit into a data storage device;

generating one or more equations representative of said logic circuit, said equations including one or more nodal equations representative of nodes of said logic circuit;

minimizing the number of said nodal equations without exceeding the logic capabilities of said programmable logic device; and translating said equations into one or more implementations of said logic circuit in said programmable logic device.

47. A method of designing a logic circuit as in claim 46 wherein said step of compiling further comprises inserting nodes into said equations at the carry-bits of arithmetic and relational operators.

48. A method of designing a logic circuit as in claim 47 wherein said step of compiling further comprises inserting nodes into said equations at function and procedure boundaries.

49. A method of designing a logic circuit as in claim 47 wherein said step of compiling further comprises inserting nodes into said equations to break up complex constructs.

50. A method of designing a logic circuit as in claim 46 wherein said step of inputting includes inputting DONT CARE information and said step of minimizing includes retaining said DONT CARE information throughout said minimization step.

51. A method of computerized electronic design comprising the steps of:

providing a data storage device having stored therein details of a plurality of programmable electronic devices;

inputting data related to a logic circuit into said data storage device;

generating a first circuit representation for an ON state of a circuit element and generating a second circuit representation for an OFF state of said circuit element;

determining DONT CARE information from said first circuit representation and said second circuit representation;

using said DONT CARE information while reducing said circuit representations; and selecting one or more of said circuit representations and implementing it into a programmable electronic device.

52. A method of computerized electronic logic circuit design comprising the steps of:

providing a data storage device have details of a plurality of programmable electronic devices stored therein, each of said devices having one or more registers;

inputting data related to a logic circuit into said data storage device, said data including register information;

designing on a computer one or more logic circuits for implementation in one or more of said programmable electronic devices;

generating a logic circuit design for every type of register available when said input data specifies a register in said logic circuit; and selecting and implementing of one of said generated circuit designs.

53. A method of computerized electronic logic circuit design as in claim 52 wherein said step of selecting comprises partitioning said logic circuit into a plurality of PLDs.

54. A method as in claim 52 wherein said step of generating comprises generating a first logic circuit design utilizing a D flip-flop, a second logic circuit utilizing a JK flip-flop, a third logic circuit design utilizing an SR flip-flop, and a fourth logic circuit design utilizing a T flip-flop when said input data specifies any flip-flop from the group comprising a D flip-flop, a JK flip-flop, an SR flip-flop, and a T flip-flop.

* * * * *